United States Patent
Ui et al.

(10) Patent No.: US 10,381,198 B2
(45) Date of Patent: Aug. 13, 2019

(54) PLASMA PROCESSING APPARATUS AND PLASMA PROCESSING METHOD

(71) Applicant: TOSHIBA MEMORY CORPORATION, Minato-ku, Tokyo (JP)

(72) Inventors: Akio Ui, Tokyo (JP); Hisataka Hayashi, Yokkaichi (JP); Kazuhiro Tomioka, Yokohama (JP); Hiroshi Yamamoto, Kuwana (JP); Tsubasa Imamura, Kuwana (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/036,588

(22) Filed: Sep. 25, 2013

(65) Prior Publication Data

US 2014/0083977 A1    Mar. 27, 2014

(30) Foreign Application Priority Data

Sep. 26, 2012  (JP) ................................. 2012-212726
May 24, 2013  (JP) ................................. 2013-109462

(51) Int. Cl.
*H01J 37/32*    (2006.01)
*H01J 37/04*    (2006.01)
(Continued)

(52) U.S. Cl.
CPC ........ *H01J 37/32422* (2013.01); *H01J 37/04* (2013.01); *H01J 37/3211* (2013.01);
(Continued)

(58) Field of Classification Search
CPC .................................................. H01J 37/32165
(Continued)

(56) References Cited

U.S. PATENT DOCUMENTS 4,464,223 A * 8/1984 Gorin ........................ C23F 4/00
156/345.45
4,539,068 A * 9/1985 Takagi ................ C23C 16/5096
117/103
(Continued)

FOREIGN PATENT DOCUMENTS

CN      101064238 A     10/2007
JP       01181513 A  *   7/1989
(Continued)

OTHER PUBLICATIONS

JP2008-027816, Kitagawa, Hideo, Plasma Processing Device, and Plasma Processing Method, Jul. 24, 2016, Canon, paragraphs ([0018]-[0025]).*

(Continued)

*Primary Examiner* — Parviz Hassanzadeh
*Assistant Examiner* — Michelle Crowell
(74) *Attorney, Agent, or Firm* — Finnegan, Henderson, Farabow, Garrett & Dunner, L.L.P.

(57) ABSTRACT

In one embodiment, a plasma processing apparatus includes: a chamber; an introducing part; a counter electrode; a high-frequency power source; and a plurality of low-frequency power sources. A substrate electrode is disposed in the chamber, a substrate is directly or indirectly placed on the substrate electrode, and the substrate electrode has a plurality of electrode element groups. The introducing part introduces process gas into the chamber. The high-frequency power source outputs a high-frequency voltage for ionizing the process gas to generate plasma. The plurality of low-frequency power sources apply a plurality of low-frequency voltages of 20 MHz or less with mutually different phases for introducing ions from the plasma, to each of the plurality of electrode element groups.

13 Claims, 19 Drawing Sheets

(51) Int. Cl.
*H01L 21/3065* (2006.01)
*H01L 21/308* (2006.01)
*H01L 21/67* (2006.01)
*H01L 21/683* (2006.01)
*H01L 21/687* (2006.01)

(52) U.S. Cl.
CPC .... *H01J 37/3244* (2013.01); *H01J 37/32091* (2013.01); *H01J 37/32165* (2013.01); *H01J 37/32568* (2013.01); *H01J 37/32697* (2013.01); *H01J 37/32715* (2013.01); *H01J 37/32724* (2013.01); *H01J 37/32834* (2013.01); *H01L 21/308* (2013.01); *H01L 21/3065* (2013.01); *H01L 21/67069* (2013.01); *H01L 21/6831* (2013.01); *H01L 21/68764* (2013.01); *H01J 2237/3341* (2013.01)

(58) Field of Classification Search
USPC .................................................. 156/345.45
See application file for complete search history.

(56) References Cited

U.S. PATENT DOCUMENTS

| | | | | |
|---|---|---|---|---|
| 4,585,516 A * | 4/1986 | Corn | | H01J 37/32165 156/345.44 |
| 4,963,242 A * | 10/1990 | Sato | | H01J 37/32587 156/345.45 |
| 5,286,297 A * | 2/1994 | Moslehi | | C23C 16/4405 118/723 E |
| 5,609,690 A * | 3/1997 | Watanabe et al. | ........ | 118/723 E |
| 5,641,375 A * | 6/1997 | Nitescu | | H01J 37/32495 156/345.1 |
| 6,228,438 B1 * | 5/2001 | Schmitt | .......................... | 427/569 |
| 6,433,297 B1 * | 8/2002 | Kojima | | H01J 37/32082 118/723 E |
| 6,741,944 B1 * | 5/2004 | Verdeyen | | H01J 37/32266 702/108 |
| 7,264,688 B1 | 9/2007 | Paterson et al. | | |
| 7,268,083 B2 | 9/2007 | Ohkuni | | |
| 7,851,367 B2 | 12/2010 | Ui | | |
| 8,642,478 B2 * | 2/2014 | Ooya et al. | .................... | 438/706 |
| 8,652,298 B2 * | 2/2014 | Dhindsa | | H01J 37/32165 156/345.45 |
| 2003/0054647 A1 * | 3/2003 | Suemasa | .......... | H01J 37/32091 438/689 |
| 2003/0057847 A1 * | 3/2003 | Strang | .............. | H01J 37/32091 315/111.31 |
| 2006/0254518 A1 * | 11/2006 | Ellingboe | ......... | H01J 37/32165 118/723 I |
| 2007/0013787 A1 * | 1/2007 | Pippel | .................. | H01H 13/023 348/223.1 |
| 2007/0074815 A1 | 4/2007 | Ohkuni | | |
| 2008/0119049 A1 * | 5/2008 | Sung et al. | .................... | 438/689 |
| 2008/0251207 A1 * | 10/2008 | Chen et al. | .............. | 156/345.48 |
| 2008/0309242 A1 * | 12/2008 | Ellingboe | ................ | 315/111.51 |
| 2008/0314318 A1 | 12/2008 | Han et al. | | |
| 2011/0031217 A1 * | 2/2011 | Himori | .......................... | 216/71 |
| 2012/0164834 A1 * | 6/2012 | Jennings et al. | .............. | 438/694 |
| 2013/0122711 A1 * | 5/2013 | Marakhtanov et al. | ...... | 438/711 |
| 2014/0139049 A1 * | 5/2014 | Fischer | .................. | B44C 1/227 307/149 |
| 2017/0169996 A1 * | 6/2017 | Ui | ..................... | H01J 37/32422 |

FOREIGN PATENT DOCUMENTS

| | | | |
|---|---|---|---|
| JP | 01230782 A * | 9/1989 | |
| JP | 07-169745 A | 7/1995 | |
| JP | 7-238843 | 9/1995 | |
| JP | 10-326772 A | 12/1998 | |
| JP | 2002009043 A * | 1/2002 | |
| JP | 2003031504 A * | 1/2003 | |
| JP | 3816081 | 6/2006 | |
| JP | 2008-27816 | 2/2008 | |
| JP | 2008-85288 | 4/2008 | |
| JP | 2008-193024 A | 8/2008 | |
| JP | 2010-10417 | 1/2010 | |
| JP | 2012-174682 A | 9/2012 | |
| KR | 10-2008-0111801 | 12/2008 | |

OTHER PUBLICATIONS

"Radians", Wikipedia, the Free Encylclopedia, Jan. 29, 2018. Web. Jan. 29, 2018., pp. 1-2 (Year: 2018).*
Office Action issued by the Korean Patent Office dated Aug. 21, 2014, in counterpart Korean Patent Application No. 2013-0111771.
First Office Action issued by the State Intellectual Property Office of the People's Republic of China dated Jul. 14, 2015, in counterpart Chinese Patent Application No. 201310443329.0.
Notification of Reasons for Refusal issued by the Japanese Patent Office dated Apr. 4, 2017, in counterpart Japanese Patent Application No. 2013-109462.

* cited by examiner

PLASMA PROCESSING APPARATUS AND PLASMA PROCESSING METHOD

CROSS REFERENCE TO RELATED APPLICATIONS

This application is based upon and claims the benefit of priority from Japanese Patent Application No. 2012-212726 filed on Sep. 26, 2012 and Japanese Patent Application No. 2013-109462, filed on May 24, 2013; the entire contents of which are incorporated herein by reference.

FIELD

Embodiments described herein relate generally to a plasma processing apparatus and a plasma processing method.

BACKGROUND

A plasma processing apparatus generates plasma, and makes ions in the plasma to be incident on a substrate (semiconductor wafer, for example), to thereby process the substrate. In a process of manufacturing a semiconductor device, when incident ions perform etching on a substrate, a trench, a via hole, a projecting portion and the like are formed.

Here, in the process of manufacturing the semiconductor device, it is important to perform fine control of processing shape, particularly vertical processing of a sidewall of trench for securing electrical performance of the semiconductor device.

However, it is not always easily to perform the fine control of processing shape, and it is usually the case that the sidewall of trench is not vertically formed, and is tapered, for example.

The present invention has an object to provide a plasma processing apparatus and a plasma processing method which make it easy to perform fine control of processing shape.

SUMMARY

A plasma processing apparatus of an embodiment includes: a chamber; an introducing part; a counter electrode; a high-frequency power source; and a plurality of low-frequency power sources. A substrate electrode is disposed in the chamber, a substrate is directly or indirectly placed on the substrate electrode, and the substrate electrode has a plurality of electrode element groups. The introducing part introduces process gas into the chamber. The high-frequency power source outputs a high-frequency voltage for ionizing the process gas to generate plasma. The plurality of low-frequency power sources apply a plurality of low-frequency voltages of 20 MHz or less with mutually different phases for introducing ions from the plasma, to each of the plurality of electrode element groups.

The plasma processing apparatus and the plasma processing method according to embodiments make it easy to perform fine control of processing shape.

BRIEF DESCRIPTION OF THE DRAWINGS

FIG. 15 is a perspective view illustrating one example of a configuration of a substrate electrode 15a.

DETAILED DESCRIPTION

Hereinafter, embodiments will be described in detail with reference to the drawings.

(First Embodiment)

Figure 1:
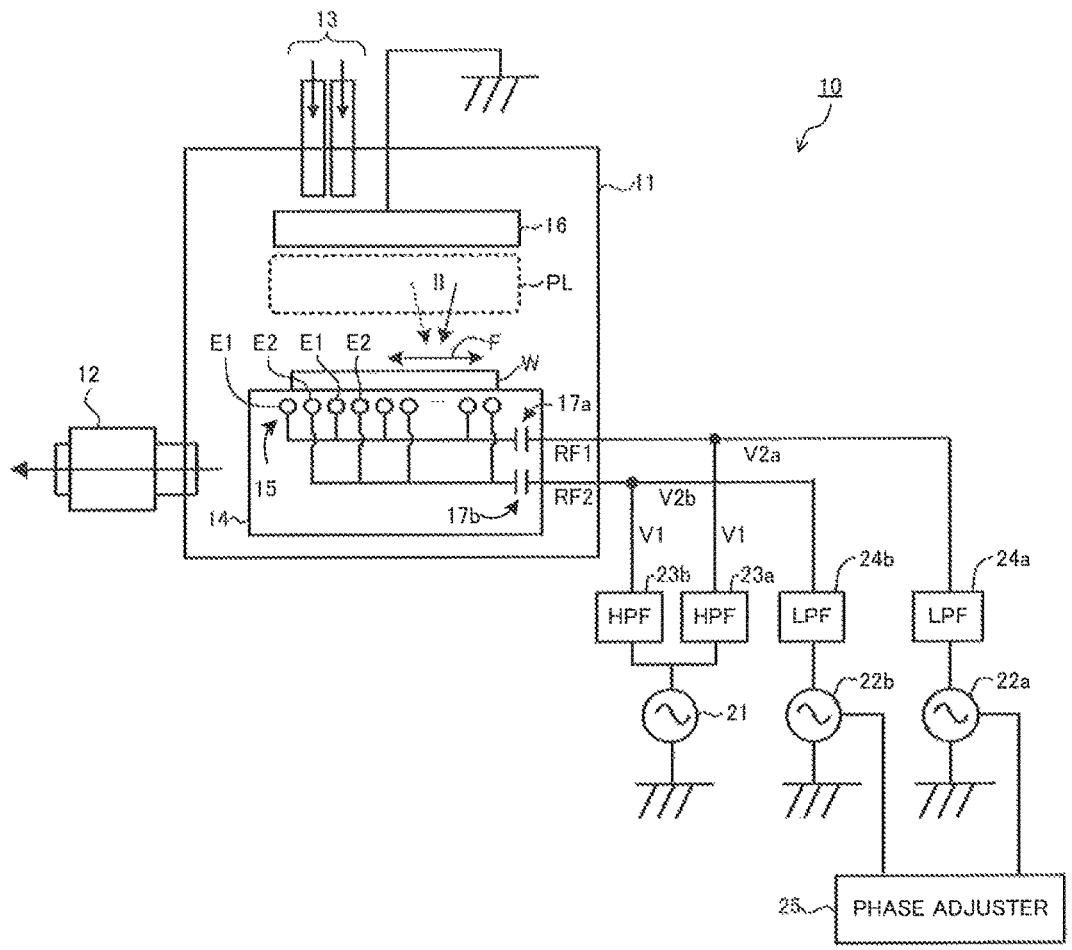
FIG. 1 is a schematic configuration diagram of a plasma processing apparatus 10 according to a first embodiment.

FIG. 1 is a schematic configuration diagram of a plasma processing apparatus 10 according to a first embodiment. The plasma processing apparatus 10 is a parallel plate type RIE (Reactive Ion Etching) apparatus.

The plasma processing apparatus 10 makes ions II in plasma PL to be incident on a wafer W to perform etching on the wafer W, thereby forming a trench, a via hole, a projecting portion and the like. The wafer W is a substrate, which is, for example, a substrate of semiconductor (Si, GaAs or the like).

Note that the plasma processing apparatus 10 is common to an ion implantation apparatus that implants ions, in a point that the ions II are made to be incident on the wafer W, but, the both pieces of apparatus are different in the next point. In the plasma processing, an energy of incident ions is lower than that in the ion implantation (about 10 k to about 500 keV in the ion implantation, and about 0 to about 2000 eV in the plasma processing). Compared to the ion implantation, the plasma processing does not require a particular accelerator, and in the plasma processing, ions II from plasma PL are introduced by a bias potential applied to a substrate electrode 15. For this reason, the plasma PL and the substrate electrode 15 come close to each other in the plasma processing apparatus 10, compared to those in the ion implantation (about 10 cm or more in the ion implantation, and about several cm or less in the plasma processing).

The plasma processing apparatus 10 has a chamber 11, an exhaust port 12, a process gas introduction pipe 13, a susceptor 14, a substrate electrode 15, a counter electrode 16, capacitors 17a, 17b, an RF high-frequency power source 21, RF low-frequency power sources 22a, 22b, filters 23a, 23b, 24a, 24b, and a phase adjuster 25.

The chamber 11 maintains an environment required to perform processing on a wafer W.

The exhaust port 12 is connected to not-illustrated pressure regulating valve and exhaust pump. Gas in the chamber 11 is exhausted from the exhaust port 12, resulting in that the inside of the chamber 11 is maintained in a high-vacuum state. Further, when process gas is introduced from the process gas introduction pipe 13, a flow rate of gas flowed in through the process gas introduction pipe 13 and a flow rate of gas flowed out through the exhaust port 12 are balanced, resulting in that a pressure in the chamber 11 is kept constant.

The process gas introduction pipe 13 introduces process gas required to perform processing on the wafer W, into the chamber 11. The process gas is used for forming plasma PL. By an electric discharge, the process gas is ionized to be turned into plasma PL, and ions II in the plasma PL are used for performing etching on the wafer W.

As the process gas, it is possible to appropriately use $SF_6$, $CF_4$, $C_2F_6$, $C_4F_8$, $C_5F_8$, $C_4F_6$, $Cl_2$, HBr, $SiH_4$, $SiF_4$ or the like, other than gas of Ar, Kr, Xe, $N_2$, $O_2$, CO, $H_2$ or the like.

Here, the process gas can be classified into deposition-type gas and depositionless-type gas. The depositionless-type gas is gas that performs only an etching operation when performing processing on the wafer W. On the other hand, the deposition-type gas performs not only the etching operation but also an operation of forming a coating film (protective film) when performing processing on the wafer W.

By using the deposition-type gas as the process gas, it is possible to improve a selection ratio of etching between an etching mask and an etching target (the wafer W or the like). Specifically, when the deposition-type gas is used, the etching proceeds during which a coating film is formed on the etching mask. As a result of this, an etching rate of the etching mask is reduced, and the selection ratio can be improved.

The classification of deposition type and depositionless type is not always an absolute one. Rare gas (Ar, Kr, Xe) does not perform the operation of forming the coating film almost at all, and thus it can be considered as pure depositionless-type gas, but, the other gas can perform the operation of forming the coating film in any way. Further, a magnitude relation between the etching operation and the operation of forming the coating film can be changed, based on a relation of a material and a shape of the etching mask and the etching target, a process pressure and the like.

Generally, Ar, Kr, Xe, $H_2$ and the like can be cited as the depositionless-type gas.

Further, $C_2F_6$, $C_4F_6$, $C_4F_8$, $C_5F_8$, $SF_6$, $Cl_2$, HBr can be cited as the deposition-type gas.

As an intermediate kind of gas between the deposition-type gas and the depositionless-type gas, there can be cited $N_2$, $O_2$, CO, and $CF_4$.

The susceptor 14 is a holding part holding the wafer W, and has a chuck for holding the wafer W. As the chuck, a mechanical chuck which dynamically holds the wafer W, or an electrostatic chuck that holds the wafer W with the use of an electrostatic force can be used. Note that explanation will be made on details of the electrostatic chuck in later-described modified examples 6, 7.

The substrate electrode 15 is an approximately plate-shaped electrode disposed on the susceptor 14 and having an upper surface which is close to or brought into contact with a lower surface of the wafer W. Specifically, the wafer W (substrate) is placed on the substrate electrode 15 indirectly (the both are close to each other) or directly (the both are brought into contact with each other).

Figure 2:
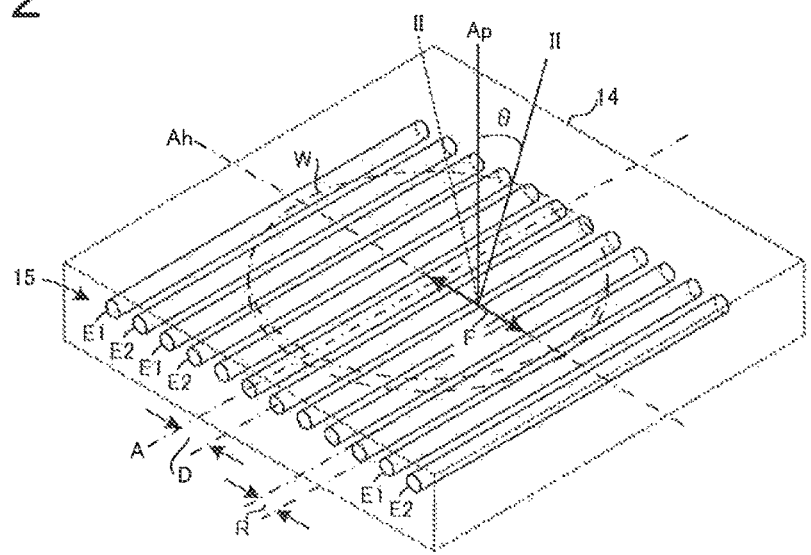
FIG. 2 is a perspective view illustrating one example of a configuration of a substrate electrode 15.

FIG. 2 is a perspective view illustrating one example of a configuration of the substrate electrode 15. As illustrated in FIG. 2, the substrate electrode 15 corresponds to divided electrodes formed by being divided in a plurality of pieces, and configured by two groups of electrode elements E1, E2 (first and second electrode element groups) which are alternately arranged.

Here, each of the two groups of electrode elements E1, E2 has a center axis along an axial direction A and an approximately column shape with a diameter of R, and the electrode elements E1, E2 are arranged in approximately parallel to each other with an interval D (distance between center axes) provided therebetween. Note that the shape of each of the electrode elements E1, E2 is not limited to the approximately column shape, and the shape may also be an approximately prism shape (approximately rectangular prism shape, for example).

At this time, it is preferable that the interval D (the diameter R as well) is (are) small to some degree (for example, the interval D is set to 5 mm or less). As will be explained in later-described examples, an incident amount of ions II has a positional dependence. It can be considered that the incident amount of ions II varies in a period corresponding to the interval D, under the influence of a periodic arrangement of the electrode elements E1, E2. For this reason, by reducing the interval D (the diameter R as well) to some degree, the uniformity of plasma processing is improved (period of variation in the incident amount of ions II is reduced).

To the substrate electrode 15, an RF high-frequency voltage V1 and RF low-frequency voltages V2a, V2b are applied from an RF high-frequency power source 21 and RF low-frequency power sources 22a, 22b.

To the electrode element E1, a voltage waveform RF1 in which the RF high-frequency voltage V1 and the RF low-frequency voltage V2a are superimposed is applied.

To the electrode element E2, a voltage waveform RF2 in which the RF high-frequency voltage V1 and the RF low-frequency voltage V2b are superimposed is applied.

The RF high-frequency voltage V1 is an alternating voltage of relatively high frequency which is applied to both of the electrode elements E1, E2, and used for generating plasma PL. The RF low-frequency voltages V2a, V2b are alternating voltages of relatively low frequency which are applied to the electrode elements E1, E2, respectively, and used for introducing the ions II from the plasma PL. As will be described later, since there is a phase difference between the RF low-frequency voltages V2a and V2b, the ions II can be diagonally incident on the wafer W from the plasma PL.

The counter electrode 16 is disposed to face the substrate electrode 15 in the chamber 11, and one end thereof is set to a ground potential. The counter electrode 16 and the substrate electrode 15 form a parallel plate electrode.

The capacitors 17a, 17b indicate combined capacitances as a result of combining capacitances on a path from the RF high-frequency power source 21, the RF low-frequency power sources 22a, 22b to the wafer W. These combined capacitances correspond to ones as a result of combining capacitances of the respective filters 23a, 23b, 24a, 24b, matching device (not illustrated), and electrostatic chuck (not illustrated).

The RF high-frequency power source 21 generates the RF high-frequency voltage V1 which is applied to the substrate electrode 15. A frequency fh of the RF high-frequency voltage V1 is not less than 40 MHz nor more than 1000 MHz, and is more preferably not less than 40 MHz nor more than 500 MHz (100 MHz, for example).

The RF low-frequency power sources 22a, 22b generate the RF low-frequency voltages V2a, V2b which are applied to the substrate electrode 15. A frequency fl of the RF low-frequency voltages V2a, V2b s not less than 0.1 MHz nor more than 20 MHz, and is more preferably not less than 0.5 MHz nor more than 14 MHz (1 MHz, for example). The RF low-frequency voltages V2a, V2b have approximately the same frequency, and have a phase difference $\alpha$ ($\pi/2$, $\pi$, for example).

The not-illustrated matching device matches the impedance of the RF high-frequency power source 21 and the RF low-frequency power sources 22a, 22b to that of the plasma PL.

As the RF high-frequency voltage V1, and the RF low-frequency voltages V2a, V2b, sine waveforms represented by the following expression (1) can be used.

$$V1 = V01 \cdot \sin(2\pi \cdot fh \cdot t)$$

$$V2a = V02 \cdot \sin(2\pi \cdot fl \cdot t)$$

$$V2b = V02 \cdot \sin(2\pi \cdot fl \cdot t + \alpha) \qquad \text{expression (1)}$$

The filters 23a, 23b (HPF (High Pass Filter)) prevent the RF low-frequency voltages V2a, V2b from the RF low-frequency power sources 22a, 22b from being input into the RF high-frequency power source 21. The filters 24a, 24b (LPF (Low Pass Filter)) prevent the RF high-frequency voltage V1 from the RF high-frequency power source 21 from being input into the RF low-frequency power sources 22a, 22b.

The phase adjuster 25 adjusts the phase difference $\alpha$ of the RF low-frequency voltages V2a, V2b from the RF low-frequency power sources 22a, 22b. It can be considered that $\pi/2$ or $\pi$, for example, is set as the phase difference $\alpha$. Note that to set the phase difference $\alpha$ to $3\pi/2$ and to set the phase difference $\alpha$ to $\pi/2$ are substantially the same, when the periodicity of the RF low-frequency voltages V2a, V2b is considered.

Figure 3:
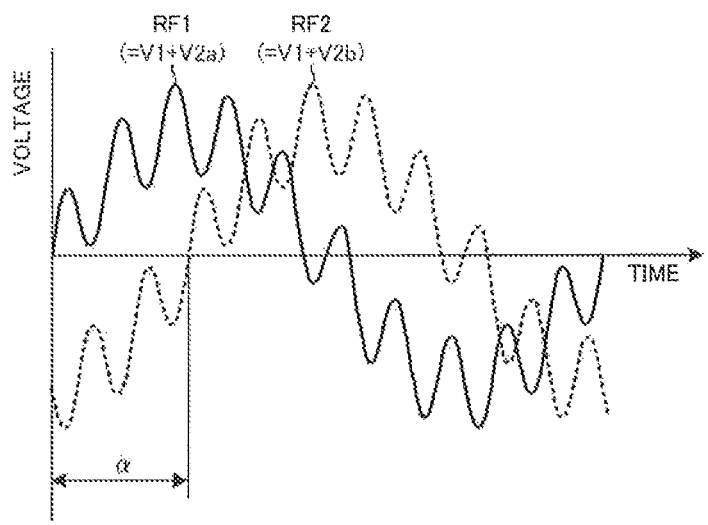
FIG. 3 is a diagram illustrating one example of voltage waveforms RF1, RF2 applied to electrode elements E1, E2.

FIG. 3 is a diagram illustrating one example of the voltage waveforms RF1, RF2 which are applied to the electrode elements E1, E2 (phase difference of $\pi/2$).

(Operation of Plasma Processing Apparatus 10)

In the chamber 11 in which an evacuation is conducted and a pressure reaches a predetermined pressure (0.01 Pa or less, for example), the wafer W is carried by a not-illustrated carrying mechanism. Next, the wafer W is held by the susceptor 14 with the use of the chuck. At this time, the substrate electrode 15 is close to or brought into contact with the wafer W.

Next, the process gas required to perform the processing on the wafer W is introduced from the process gas introduction pipe 13. At this time, the process gas introduced into the chamber 11 is exhausted at a predetermined rate from the exhaust port 12 by the not-illustrated pressure regulating valve and exhaust pump. As a result of this, the pressure in the chamber 11 is kept constant (about 1.0 to about 6.0 Pa, for example).

Next, the RF high-frequency voltage V1, and the RF low-frequency voltages V2a, V2b from the RF high-frequency power source 21, and the RF low-frequency power sources 22a, 22b are applied to the substrate electrode 15. To the electrode element E1, the voltage waveform RF1 in which the RF high-frequency voltage V1 and the RF low-frequency voltage V2a are superimposed is applied. To the electrode element E2, the voltage waveform RF2 in which the RF high-frequency voltage V1 and the RF low-frequency voltage V2b are superimposed is applied.

A density of the plasma PL is controlled by the RF high-frequency voltage V1 from the RF high-frequency power source 21. An incident energy of ions II which are incident on the wafer W is controlled by the RF low-frequency voltages V2a, V2b from the RF low-frequency power sources 22a, 22b. The wafer W is etched by the ions II having the energy with a value which is equal to or more than a threshold value in the etching process of the wafer W.

Figure 4:
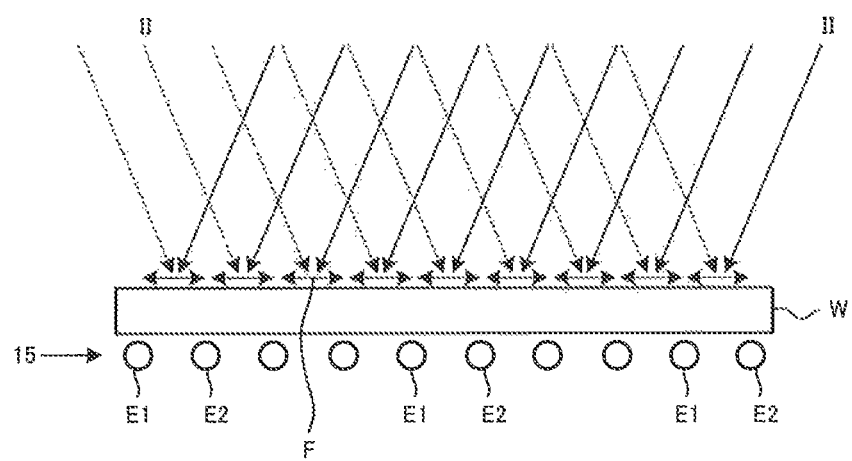
FIG. 4 is a schematic diagram illustrating one example of ions II which are incident on a wafer W.

FIG. 4 is a schematic diagram illustrating one example of ions II which are incident on the wafer W.

The RF low-frequency voltages V2a, V2b are applied to the electrode elements E1, E2 (substrate electrode 15). When the RF low-frequency voltages V2a, V2b are applied between the substrate electrode 15 and the counter electrode 16, there is generated an electric field (vertical electric field) in a direction Ap which is perpendicular to a plane of the substrate electrode 15 (wafer W) (refer to FIG. 2). As a result of this, the ions II in the plasma PL are introduced into the substrate electrode 15 (wafer W).

Here, the RF low-frequency voltages V2a, V2b which are applied to the electrode elements E1, E2 have the phase difference α. For this reason, there is generated an electric field F in a direction parallel to the plane of the substrate electrode 15 (wafer W) and parallel to a direction Ah which is orthogonal to the axial direction A of the electrode elements E1, E2, in addition to the vertical electric field (refer to FIG. 2, FIG. 4). As a result of this, by corresponding to the electric field F, the ions II are incident to have an incident angle θ (diagonally incident) with respect to the vertical direction. When the ions II are diagonally incident, it becomes possible to perform the etching on the wafer W with high precision. Note that details of this will be described later.

The electric field F is oscillated in accordance with the period of the RF low-frequency voltages V2aV2b As a result of this, the incident angle θ of ions II is periodically oscillated in accordance with the period of the RF low-frequency voltages V2a, V2b.

As described above, the ion with the incident angle θ in the positive direction and the ion with the incident angle θ in the negative direction are alternately incident on the wafer W along the axial direction A. Specifically, in the present embodiment, the following becomes possible.

(1) The ions II can be diagonally incident on the wafer W at the incident angle θ. As will be described later, by using the diagonally incident ions II, it becomes possible to perform processing with high precision when forming the trench or the projecting portion, while reducing the taper.

In particular, when forming the trench or the projecting portion along the axial direction A, the amount of ions II which are incident on a sidewall of the trench or the like is increased, resulting in that the taper can be reduced. Specifically, it is preferable to make a direction of the trench or the projecting portion (direction of processing line on the wafer W) and the axial direction A of the electrode elements E1, E2 coincide with each other.

(2) The ions II can be diagonally incident on both sides of the trench or the projecting portion along the axial direction A. As a result of this, it is possible to reduce the taper on both sidewalls of the trench.

(Comparative Example)

Figure 5:
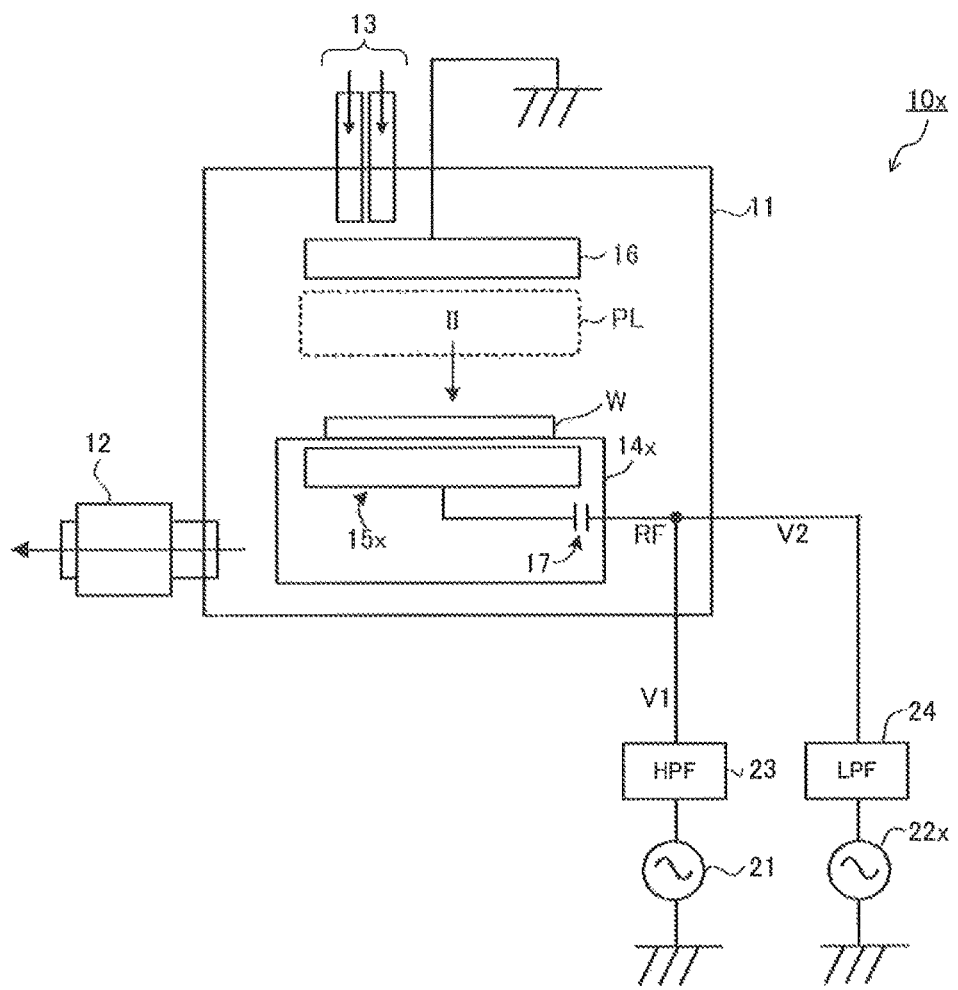
FIG. 5 is a schematic configuration diagram of a plasma processing apparatus 10x according to a comparative example.

FIG. 5 is a schematic configuration diagram of a plasma processing apparatus 10x according to a comparative example. The plasma processing apparatus 10x has the chamber 11, the exhaust port 12, the process gas introduction pipe 13, a susceptor 14x, a substrate electrode 15x, the counter electrode 16, a capacitor 17, the RF high-frequency power source 21, and an RF low-frequency power source 22x.

Figure 6:
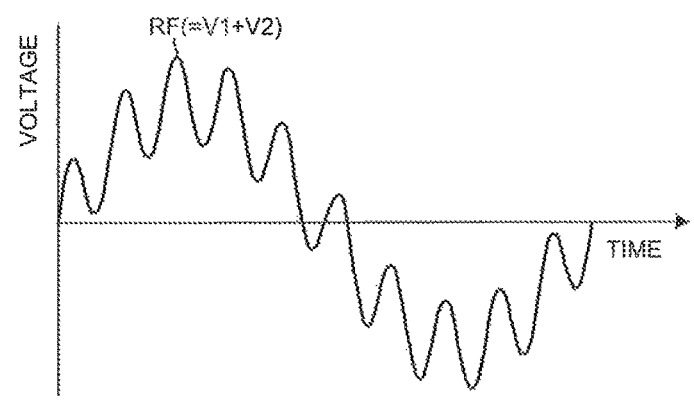
FIG. 6 is a diagram illustrating one example of a voltage waveform RF applied to a substrate electrode 15x.

The substrate electrode 15x is different from the substrate electrode 15, and has a plate shape with no electrode elements provided thereto (the substrate electrode 15x is not divided). FIG. 6 is a diagram illustrating one example of a voltage waveform RF which is applied to the substrate electrode 15x. The RF high-frequency voltage V1 from the RF high-frequency power source 21 and an RF low-frequency voltage V2 from the RF low-frequency power source 22x are superimposed to be applied to the substrate electrode 15x, which generates plasma PL and introduces ions II.

Since the substrate electrode 15x is not divided, in the plasma processing apparatus 10x, no electric field F parallel to the plane of the wafer W is generated. For this reason, the ions II are incident, from the plasma PL, only in a direction perpendicular to the plane of the wafer W, and basically, little ions II which are diagonally incident exist due to thermal fluctuation. As a result of this, it is difficult to perform precision processing using the diagonally incident ions II.

(Comparison Between Embodiment And Comparative Example)

Hereinafter, a difference in the result of etching in the plasma processing apparatus 10 according to the embodiment and the plasma processing apparatus 10x according to the comparative example will be described.

Figure 7:
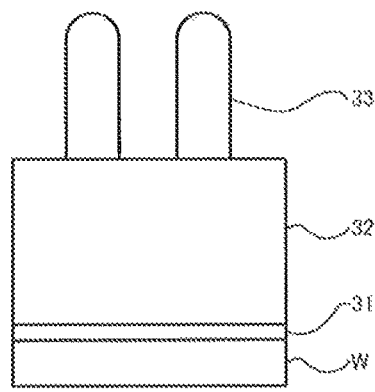
FIG. 7 is a schematic sectional diagram illustrating a state of wafer W before processing.

FIG. 7 is an enlarged sectional diagram illustrating a part of wafer W before being subjected to processing in a plasma processing apparatus. On the wafer W, layers 31, 32, and a mask 33 are formed. Materials of the layers 31, 32 are different materials, which are, for example, $SiO_2$ and Si. A material of the mask 33 is, for example, a resist or $SiO_2$, which is difficult to be etched, compared to the layer 32.

Figure 8:
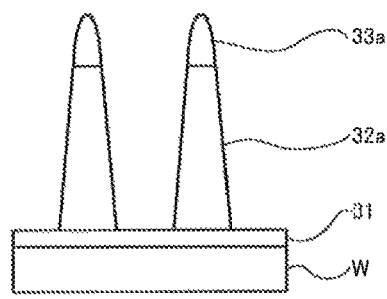
FIG. 8 is a schematic sectional diagram illustrating one example of a state of wafer W after being subjected to processing in the plasma processing apparatus 10x.
Figure 9:
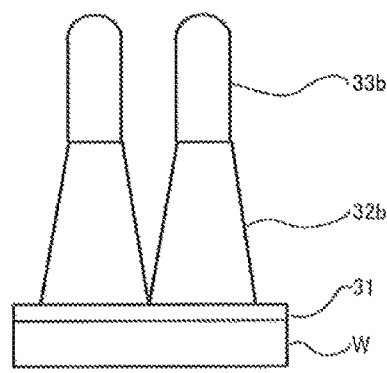
FIG. 9 is a schematic sectional diagram illustrating one example of a state of wafer W after being subjected to processing in the plasma processing apparatus 10x.

FIG. 8 and FIG. 9 are enlarged sectional diagrams each illustrating a state after such a wafer W is etched in the plasma processing apparatus 10x. FIG. 8 illustrates a case where the depositionless-type gas is used as the process gas, and FIG. 9 illustrates a case where the deposition-type gas is used as the process gas.

As illustrated in FIG. 8, when the depositionless-type gas is used as the process gas, since the selection ratio between the mask 33 and the layer 32 is small, an etching amount of the mask 33 is large, and it becomes difficult to perform precision processing on the layer 32.

As illustrated in FIG. 9, when the deposition-type gas is used as the process gas, the selection ratio between the mask 33 and the layer 32 becomes large, resulting in that the etching amount of the mask 33 becomes small. However, the layer 32 is easily etched in the diagonal direction (the etched side surface is tapered). This is because a protective film is formed on the side surface due to the deposition-type gas, and meanwhile, the side surface is difficult to be subjected to the etching operation performed by ions II which are vertically incident. As described above, when the deposition-type gas is used, in particular, it becomes possible to increase the selection ratio, but, it is difficult to perform vertical processing (precision processing).

Further, the number of ions II which hit against the etched side surface (sidewall of trench) is small, so that a residue or adherent is easily deposited, which also makes it difficult to perform the precision processing.

Figure 10:
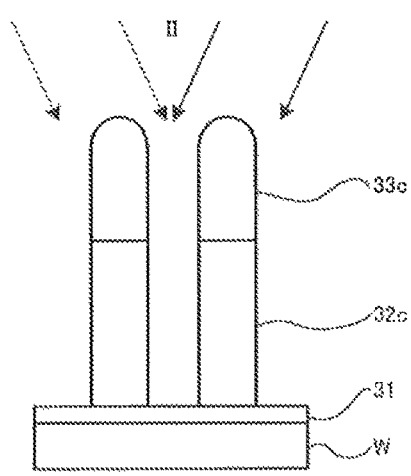
FIG. 10 is a schematic sectional diagram illustrating one example of a state of wafer W after being subjected to processing in the plasma processing apparatus 10.

FIG. 10 is an enlarged sectional diagram illustrating a state after the wafer W is etched in the plasma processing apparatus 10. Here, a case where the deposition-type gas is used as the process gas, is illustrated. By using the deposition-type gas as the process gas, the selection ratio between the mask 33 and the layer 32 becomes large, resulting in that the etching amount of the mask 33 is small.

Further, the layer 32 is vertically etched (the etched side surface is not tapered). The ions II are diagonally incident on both sides of the etched side surface (sidewall of trench), so that the taper on the side surface is reduced.

Here, there is no need to use the diagonally incident ions II in all of the processes of the formation of trench. It is also possible that the ions II are vertically incident up to the middle of the formation of trench, and thereafter, the ions II are diagonally incident. Specifically, it is also possible that the phase adjuster 25 adjusts the phase α in accordance with the progress of the plasma processing process. Note that details thereof will be described in third and fourth embodiments.

As described above, in the present embodiment, the ions II can be diagonally incident on the wafer W at the incident angle θ. As a result of this, it becomes possible to perform the precision etching processing in which the vertical processing on the sidewall is easily performed, and the residue is difficult to be remained on the sidewall.

(Modified Example 1)

Figure 11:
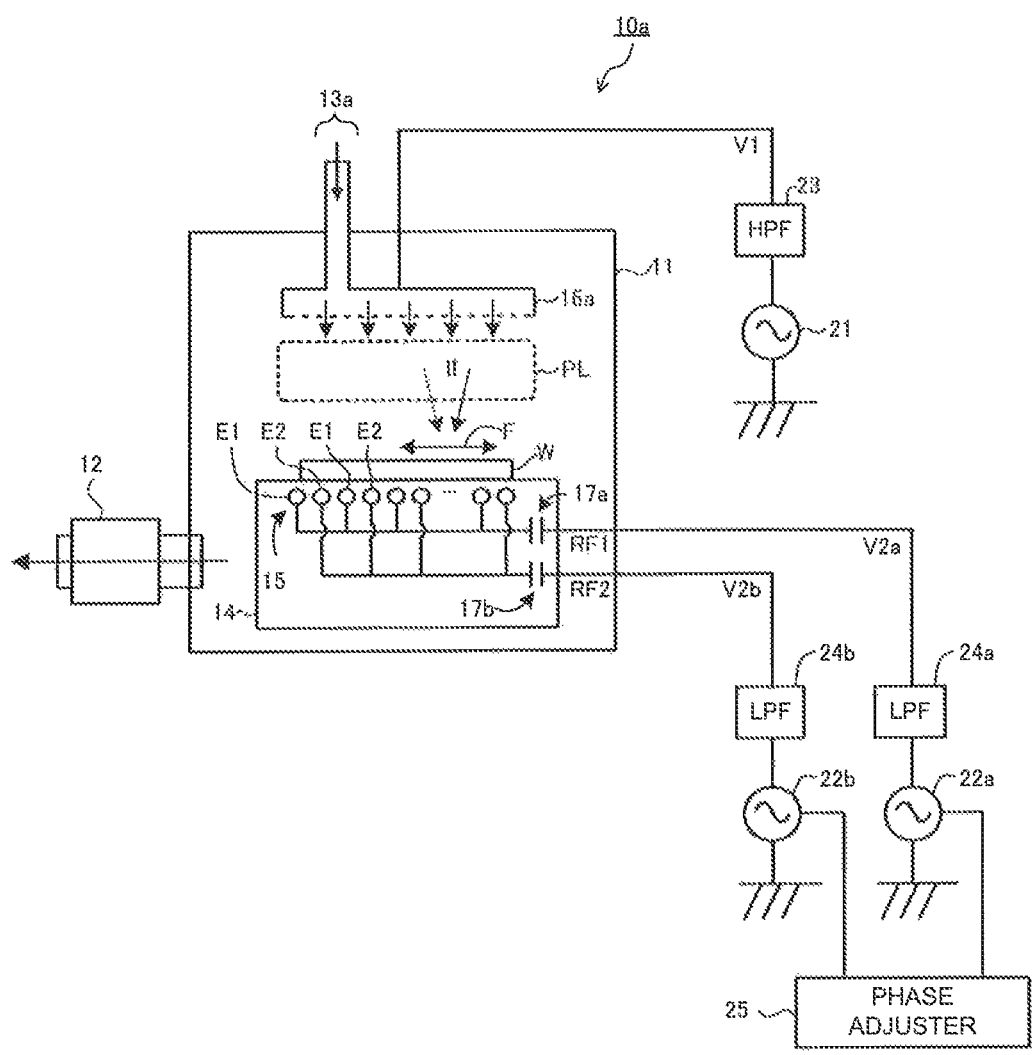
FIG. 11 is a schematic configuration diagram of a plasma processing apparatus 10a according to a modified example 1.

FIG. 11 is a schematic configuration diagram of a plasma processing apparatus 10a according to a modified example 1. The plasma processing apparatus 10a has the chamber 11, the exhaust port 12, a process gas introduction pipe 13a, the susceptor 14, the substrate electrode 15, a counter electrode 16a, the capacitors 17a, 17b, the RF high-frequency power source 21, the RF low-frequency power sources 22a, 22b, filters 23, 24a, 24b, and the phase adjuster 25.

The counter electrode 16a is a so-called showerhead, and has an internal space and a plurality of openings. Process gas is introduced from the process gas introduction pipe 13a to pass through the inside of the counter electrode 16a, and is then introduced into the chamber 11 from the plurality of openings of the counter electrode 16a. Specifically, the counter electrode 16a functions as an introducing part introducing the process gas into the chamber 11.

The modified example 1 is different from the first embodiment in that the RF high-frequency power source 21 is electrically connected not to the substrate electrode 15 but to the counter electrode 16a. Specifically, although the substrate electrode 15 rather serves to generate the plasma PL in the first embodiment, the counter electrode 16a serves to generate the plasma PL in the modified example 1.

The modified example 1 is not largely different from the first embodiment in the other points, so that the other explanation thereof will be omitted.

(Modified Example 2)

Figure 12:
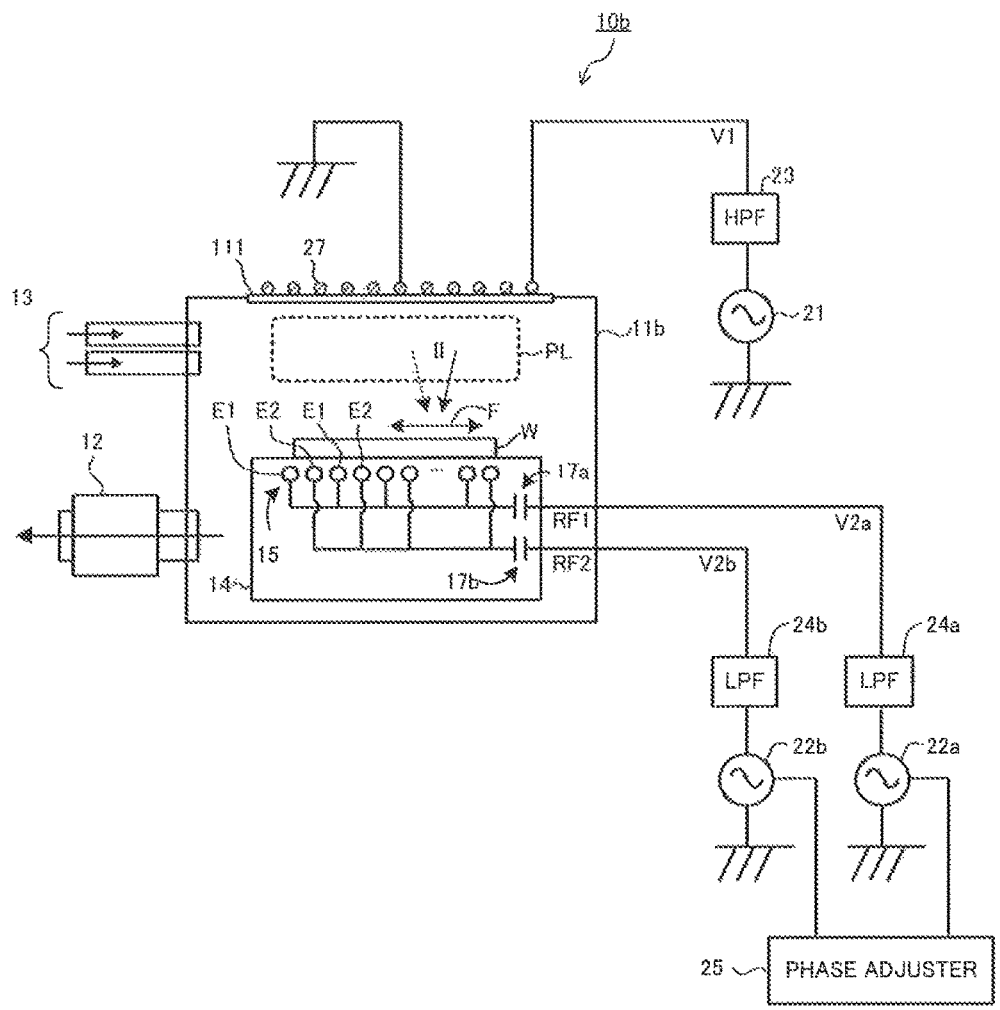
FIG. 12 is a schematic configuration diagram of a plasma processing apparatus 10b according to a modified example 2.
Figure 13:
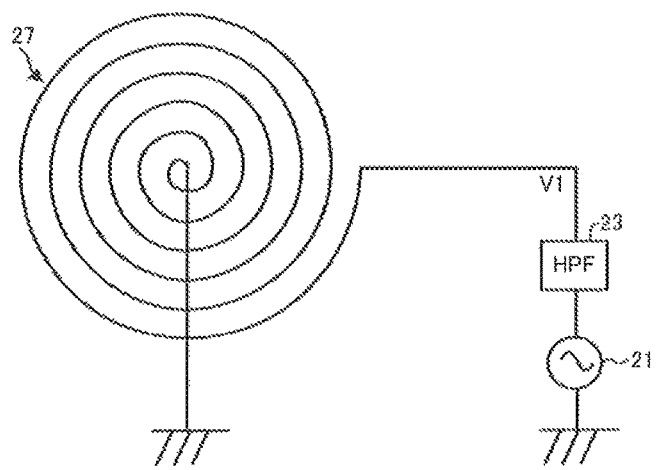
FIG. 13 is a plan view illustrating an induction coil 27.

FIG. 12 is a schematic configuration diagram of a plasma processing apparatus 10b according to a modified example 2. The plasma processing apparatus 10b has a chamber 11b, the exhaust port 12, the process gas introduction pipe 13, the susceptor 14, the substrate electrode 15, the capacitors 17a, 17b, the RF high-frequency power source 21, the RF low-frequency power sources 22a, 22b, the filters 23, 24a, 24b, the phase adjuster 25, a window 111, and an induction coil 27. FIG. 13 illustrates a state where the induction coil 27 is seen from the above in FIG. 12.

The plasma processing apparatus 10b is different from the plasma processing apparatus 10a in that it does not have the counter electrode 16 but has the window 111 and the induction coil 27.

The window 111 isolates the inside of the chamber 11b from the atmosphere, and a magnetic field from the induction coil 27 is passed through the window 111. As the window 111, a plate of nonmagnetic material such as quartz, for example, is used.

The induction coil 27 is disposed on the outside of the chamber 11b. When the high-frequency voltage from the RF high-frequency power source 21 is applied to the induction coil 27, a varying magnetic field is generated, resulting in that the process gas in the chamber 11b is ionized, and the plasma PL is generated.

The modified example 2 is not largely different from the first embodiment in the other points, so that the other explanation thereof will be omitted.

In each of the first embodiment and the modified examples 1, 2, it is possible to ionize the process gas to generate the plasma, with the use of the RF high-frequency voltage V1 of 40 MHz or more. Specifically, even in a case where the plasma PL is generated without applying the RF high-frequency voltage V1 to the substrate electrode 15, as illustrated in the modified examples 1, 2, it is possible to control the incident angle θ of the ions II by using the substrate electrode 15.

(Second Embodiment)

Figure 14:
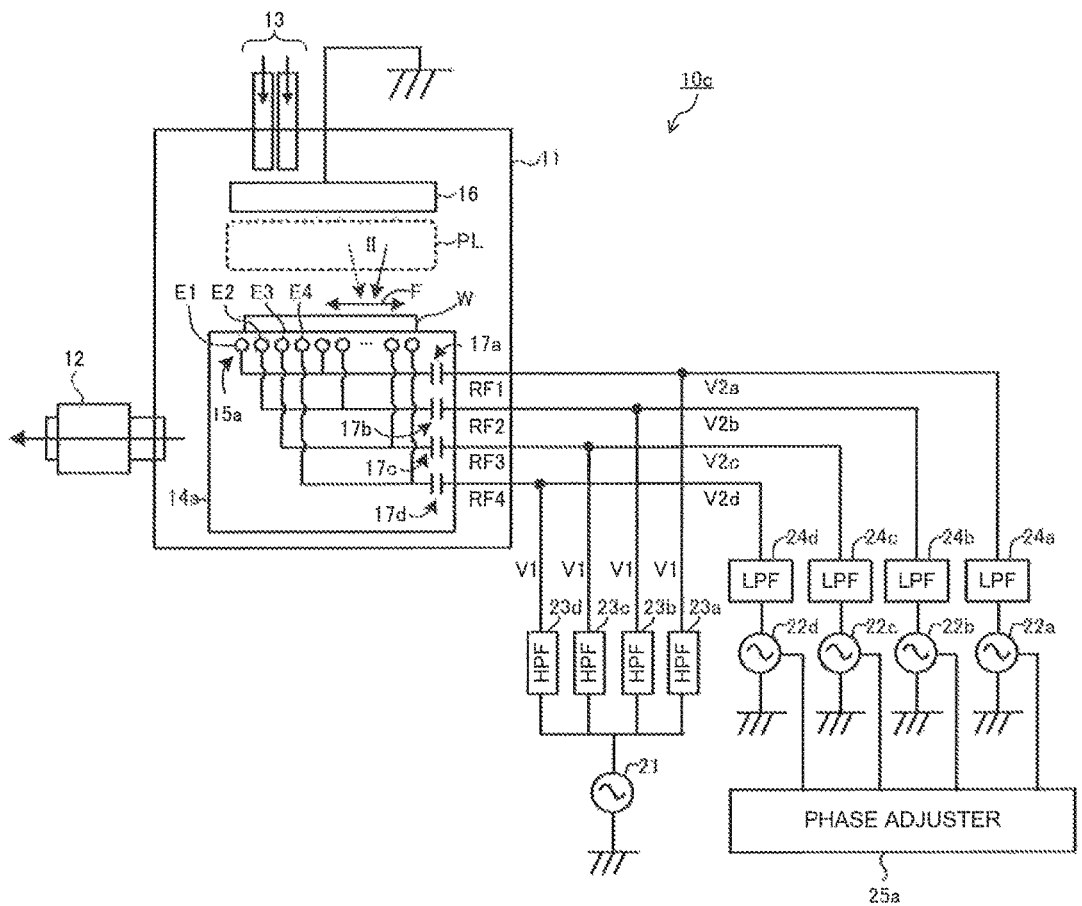
FIG. 14 is a schematic configuration diagram of a plasma processing apparatus 10c according to a second embodiment.

FIG. 14 is a schematic configuration diagram of a plasma processing apparatus 10c according to a second embodiment. The plasma processing apparatus 10c has the chamber 11, the exhaust port 12, the process gas introduction pipe 13, a susceptor 14a, a substrate electrode 15a, the counter electrode 16, capacitors 17a to 17d, the RF high-frequency power source 21, RF low-frequency power sources 22a to 22d, filters 23a to 23d, and 24a to 24d, and a phase adjuster 25a.

Figure 15:
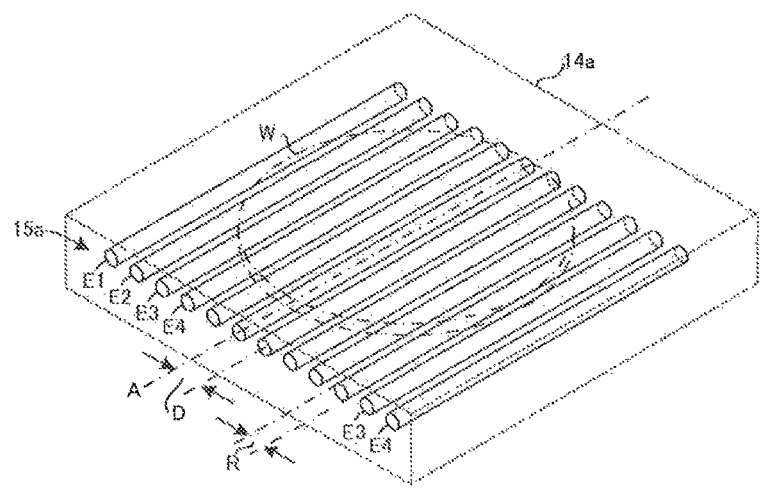

FIG. 15 is a perspective view illustrating one example of a configuration of the substrate electrode 15a.

In the plasma processing apparatus 10, the substrate electrode 15 is formed of the two groups of electrode elements E1, E2. On the contrary, in the plasma processing apparatus 10c, the substrate electrode 15a is formed of four groups of electrode elements E1 to E4 (first to fourth electrode element groups). By classifying the electrode elements forming the substrate electrode 15a into smaller groups, it is possible to more finely control the electric field F, and to control the incident of ions II.

The RF low-frequency power sources 22a to 22d apply RF low-frequency voltages V2a to V2d to the electrode elements E1 to E4, respectively. The RF low-frequency voltages V2a to V2d have phase differences α1, α2, α3, on the basis of the RF low-frequency voltage V2a.

As the RF high-frequency voltage V1, and the RF low-frequency voltages V2a to V2d, sine waveforms represented by the following expression (2) can be used.

$$V1 = V01 \cdot \sin(2\pi \cdot fh \cdot t)$$

$$V2a = V02 \cdot \sin(2\pi \cdot fl \cdot t)$$

$$V2b = V02 \cdot \sin(2\pi \cdot fl \cdot t + \alpha 1)$$

$$V2c = V02 \cdot \sin(2\pi \cdot fl \cdot t + \alpha 2)$$

$$V2d = V02 \cdot \sin(2\pi \cdot fl \cdot t + \alpha 3) \quad \text{expression (2)}$$

The filters 24a to 24d (LPF (Low Pass Filter)) prevent the RF high-frequency voltage V1 from the RF high-frequency power source 21 from being input into the RF low-frequency power sources 22a to 22d.

The filters 23a to 23d (HPF (High Pass Filter)) prevent the RF low-frequency voltages V2a to V2d from the RF low-frequency power sources 22a to 22d from being input into the RF high-frequency power source 21.

The phase adjuster 25a adjusts the phase differences α1, α2, α3 of the RF low-frequency voltages V2a to V2d from the RF low-frequency power sources 22a to 22d. It can be considered that as the phase differences α1, α2, α3, for example, a combination of "π/2, π, 3π/2" or "−π/2, −π, −3π/2" is employed.

Figure 16:
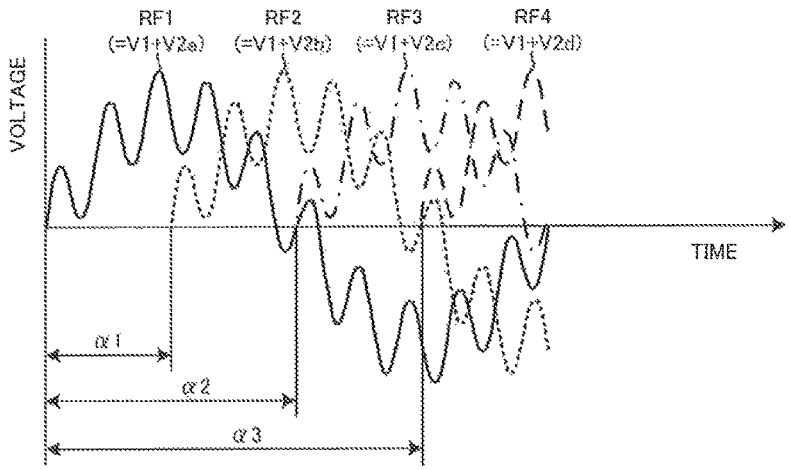
FIG. 16 is a diagram illustrating one example of voltage waveforms RF1 to RF4 applied to electrode elements E1 to E4.

FIG. 16 is a diagram illustrating one example of voltage waveforms RF1 to RF4 which are applied to the electrode elements E1 to E4. The voltage waveform RF1 is a waveform in which the RF high-frequency voltage V1 and the RF low-frequency voltage V2a are superimposed, the voltage waveform RF2 is a waveform in which the RF high-frequency voltage V1 and the RF low-frequency voltage V2b are superimposed, the voltage waveform RF3 is a waveform in which the RF high-frequency voltage V1 and the RF low-frequency voltage V2c are superimposed, and the voltage waveform RF4 is a waveform in which the RF high-frequency voltage V1 and the RF low-frequency voltage V2d are superimposed.

(Modified Example 3)

In the above-described embodiments, the substrate electrodes 15, 15a are formed of the two groups of electrode elements E and the four groups of electrode elements E, respectively, and to the respective groups, the RF low-frequency voltages V2a to V2d having the phase differences are applied.

On the contrary, it is also possible that the substrate electrode 15 is formed of three groups of or five groups or more of electrode elements E. Even in this case, by applying the RF low-frequency voltages V2 having the phase differences to the respective groups of electrode elements, it becomes possible to form the electric field F and to make the ions II to be diagonally incident.

If the above is generalized, it can be considered that the substrate electrode 15 is formed of n groups of electrode elements E1 to En (first to n-th electrode element groups) (n: integer of 2 or more). At this time, the electrode elements E1 to En are repeatedly arranged in ascending order, for example. Further, first to n-th low-frequency voltages having different phases from first to n-th low-frequency power sources are applied to the electrode elements E1 to En, respectively.

At this time, to make phases between low-frequency voltages applied to adjacent electrode elements to be different by $(2\pi/n)$ (phase $\alpha i=(2\pi/n)\cdot i$) contributes to the uniform plasma processing on the wafer W (refer to examples).

(Third Embodiment)

Figure 17:
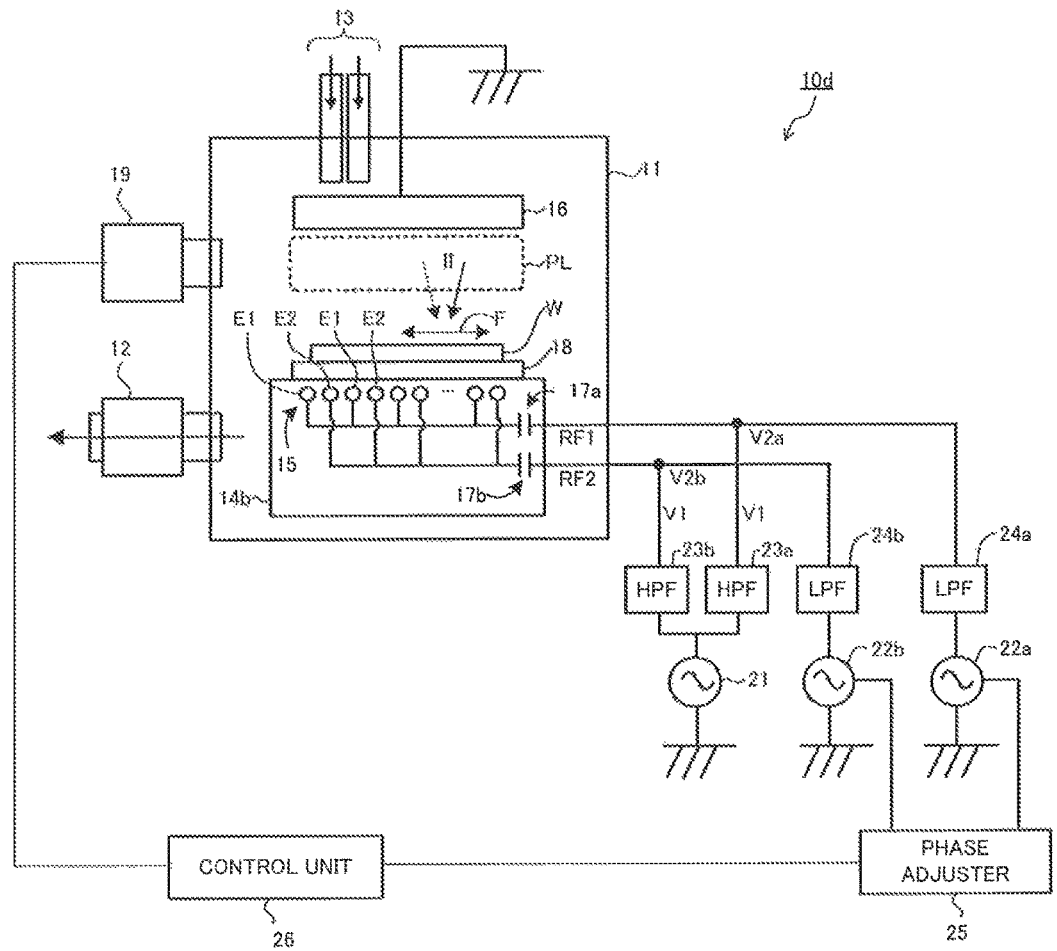
FIG. 17 is a schematic configuration diagram of a plasma processing apparatus 10d according to a third embodiment.

FIG. 17 is a schematic configuration diagram of a plasma processing apparatus 10d according to a third embodiment. The plasma processing apparatus 10d has the chamber 11, the exhaust port 12, the process gas introduction pipe 13, a susceptor 14b, the substrate electrode 15, the counter electrode 16, the capacitors 17a, 17b, a wafer rotating mechanism 18, a termination detector 19, the RF high-frequency power source 21, the RF low-frequency power sources 22a, 22b, the filters 23a, 23b, 24a, 24b, the phase adjuster 25, and a control unit 26.

Note that it is also possible that the substrate electrode 15 is formed of three groups of or five groups or more of electrode elements, and the RF low-frequency voltages V2 having the phase differences are applied to the respective groups of electrode elements, as in the second embodiment and the modified examples.

Compared to the plasma processing apparatus 10, to the plasma processing apparatus 10d, the wafer rotating mechanism 18, the termination detector 19, and the control unit 26 are added.

The wafer rotating mechanism 18 relatively rotates the wafer W with respect to the substrate electrode 15, to thereby change a direct ion of the wafer W with respect to the axial direction A of the electrode elements E1, E2 of the substrate electrode 15. The rotation may be either a temporary rotation or a continuous rotation.

The termination detector 19 detects the termination of etching, based on a change in emission spectrum of the plasma PL, for example. When composing materials of the layers 32, 31 are different, the emission spectrum of the plasma PL is changed due to the difference in these composing materials, resulting in that the termination of etching of the layer 32 (exposure of the layer 31) can be detected.

The control unit 26 controls the wafer rotating mechanism 18, and the phase adjuster 25 in accordance with the transition of process (detection result in the termination detector 19 or time shift).

(1) The control unit 26 can control the wafer rotating mechanism 18 in a manner as in the following a) and b).

a) The wafer W is rotated so that the direction of trench and the axial direction A of the electrode elements E1, E2 illustrated in FIG. 2 coincide with each other (the directions are approximately parallel to each other). By performing, after that, the plasma processing, it is possible to improve the processing precision of the trench.

b) The wafer W is continuously rotated during the plasma processing. By designing as above, it is possible to improve the processing precision without depending on the direction of trench. Specifically, the precision processing and vertical processing of a sidewall of via hole are realized.

Figure 18:
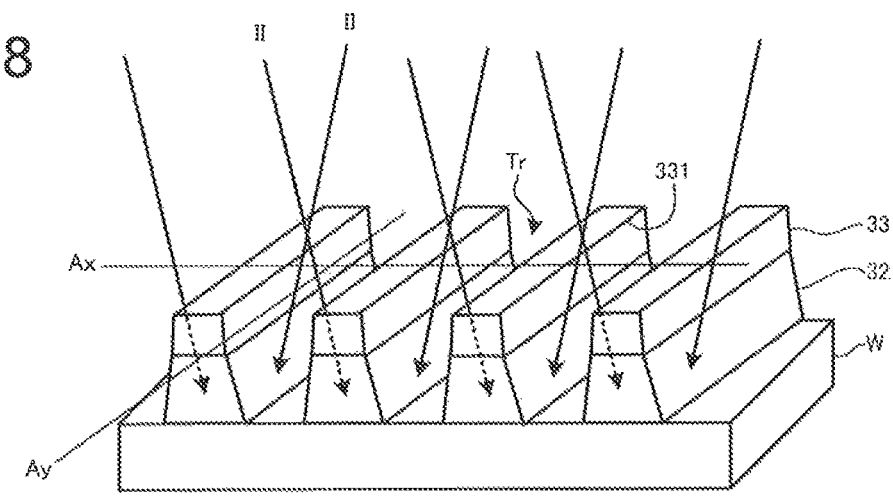
FIG. 18 is a diagram illustrating a state where plasma processing is performed on sidewalls of trenches.
Figure 19:
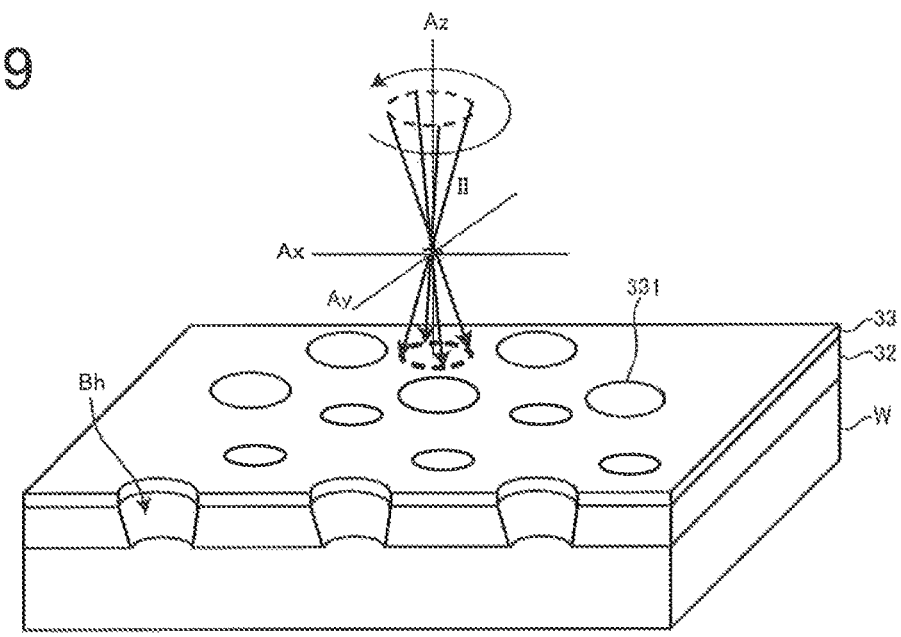
FIG. 19 is a diagram illustrating a state where plasma processing is performed on a sidewall of via.

FIG. 18 illustrates a state where sidewalls of trenches are processed, and FIG. 19 illustrates a state where a sidewall of via is processed. The layer 32 and the mask 33 are formed on the wafer W. In FIG. 18, the mask 33 has a plurality of rectangular openings 331 along an axis Ay. In FIG. 19, the mask 33 has a plurality of circular openings 331.

By making the ions II to be incident from above the wafer W, a trench Tr is formed in FIG. 18, and a via hole Bh is formed in FIG. 19. Basically, the trench Tr is formed in FIG. 18, and the via hole Bh is formed in FIG. 19 due to the difference in shapes of the openings 331 formed on the mask 33.

Here, it is set that the wafer W is not rotated in FIG. 18, by corresponding to the first and second embodiments. On the other hand, it is set that the wafer W is rotated in FIG. 19, by corresponding to the third embodiment. Further, it is set that in FIG. 18, the axis Ay coincides with the axis of the electrode element E illustrated in FIG. 2 and FIG. 15.

At this time, in FIG. 18, the incident angle θ of the ions II is changed in which the axis Ay is set as a rotation axis. As a result of this, the ions II are efficiently incident on the sidewall of the trench Tr. As described above, in order to efficiently form the trench Tr, it is preferable that the axis of the opening 331 of the trench Tr and the axis of the electrode element E are made to coincide with each other, and the wafer W is not rotated.

On the contrary, in FIG. 19, the wafer W is rotated, and the incident angle of the ions II with respect to the axis Ax and that with respect to the axis Ay are symmetric (the ions II are diagonally incident from all directions). As a result of this, it is possible to easily form the via holes Bh symmetric with respect to a vertical axis Az of the wafer W. As described above, in order to form the via hole Bh with good shape, it is preferable to rotate the wafer W.

Note that, as will be described in later-described fifth embodiment, a similar effect can be achieved by rotating the electric field without changing a relative angle between the wafer W and the substrate electrode 15.

(2) The control unit 26 can control the phase adjuster 25 in the following manner.

The phase difference α between the RF low-frequency voltages V2a and V2b from the RF low-frequency power sources 22a, 22b is set to 0 up to the middle of the formation of the trench, and thereafter, the phase difference α is set to a value other than 0 (n/2, for example). Specifically, the phase adjuster 25 is controlled in accordance with the progress of the plasma processing process, and the incident direction of the ions II is switched from the direction of vertical incidence to the direction of diagonal incidence.

By designing as above, it becomes possible to realize both of the securement of etching rate in a depth direction when the vertical incidence occurs and the reduction in taper when the diagonal incidence occurs. The etching rate when the diagonal incidence occurs is smaller than that when the vertical incidence occurs. This is because, when the diagonal incidence occurs, an area on the wafer W on which the ions are incident becomes large, and the number of incident ions per unit area is reduced, compared to the time in which the vertical incidence occurs.

Note that for switching the time when the vertical incidence occurs and the time when the diagonal incidence occurs, the detection of termination of etching of the layer 32 detected by the termination detector 19 or the passage of predetermined processing time can be utilized.

(Modified Examples 4 to 6)

Hereinafter, modified examples of the second embodiment (modified examples 4 to 6) will be described. The modified examples 4 to 6 are for specifically explaining a mechanism that relatively rotates between the wafer W and the substrate electrode 15. Accordingly, each of the modified examples is illustrated by a partial configuration diagram which omits a part other than a part of the rotating mechanism.

(1) Modified Example 4

Figure 20:
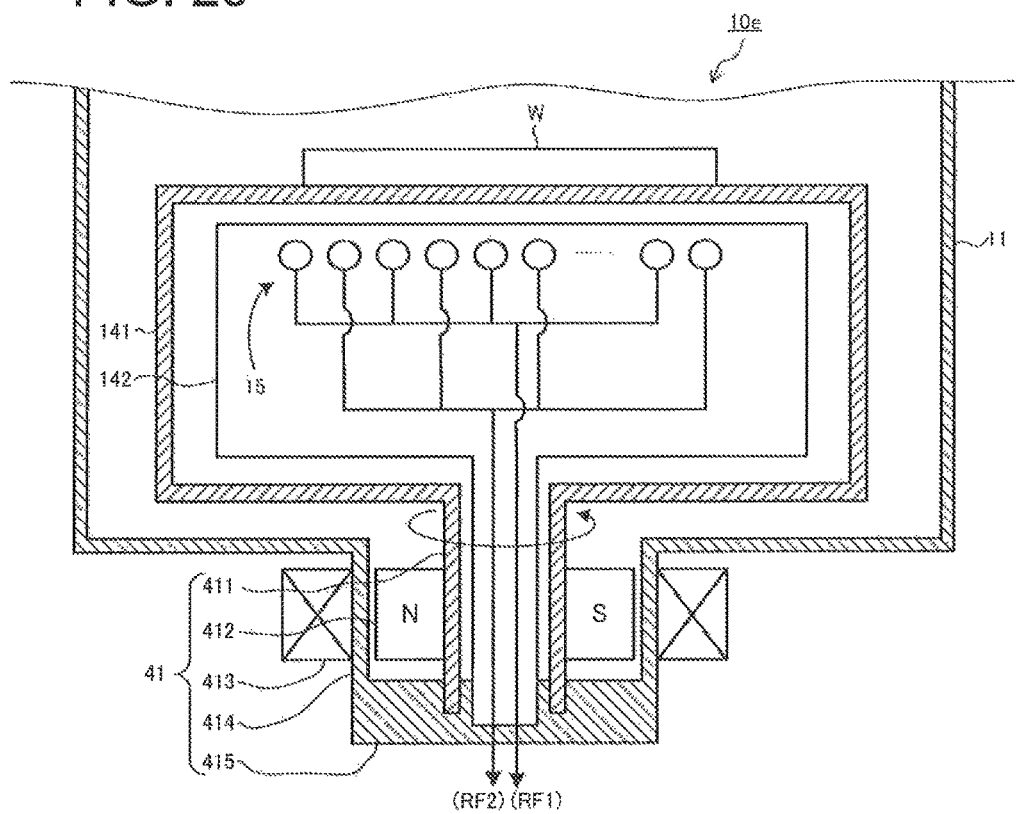
FIG. 20 is a partial configuration diagram of a plasma processing apparatus 10e according to a modified example 4.

FIG. 20 is a partial configuration diagram of a plasma processing apparatus 10e according to the modified example 4. The plasma processing apparatus 10e has a susceptor 141, a substrate electrode block 142, and a motor 41, in place of the susceptor 14b, and the wafer rotating mechanism 18 in the plasma processing apparatus 10d.

The motor 41 is provided for rotating the susceptor 141, and has a rotating shaft 411, a rotor 412, a stator 413, a side plate 414, and a bottom plate 415.

The rotating shaft 411, the rotor 412, and the stator 413 form a rotating mechanism. The rotating shaft 411 is connected to the susceptor 141. The rotating shaft 411 is formed in a cylindrical shape, and in the inside thereof, a shaft of the substrate electrode block 142 is disposed. The rotor 412 is a magnet disposed on a side surface of the rotating shaft 411. The stator 413 is an electromagnet disposed on the outside of the side plate 414 so as to approximate to the rotor 412 with the side plate 414 therebetween. By a magnetic force generated by periodically changing the north pole and the south pole of the magnetic field of the stator 413, the rotor 412 rotates with respect to the stator 413. As a result of this, the rotating shaft 411 and the rotor 412 in the chamber 11 (vacuum side), and the stator 413 on the outside of the chamber 11 (atmosphere side) are separated from each another.

Note that in this case, the rotor 412 uses the permanent magnet and the stator 413 uses the electromagnet, but, it is also possible that the rotor 412 uses the electromagnet and the stator 413 uses the permanent magnet, or both of the rotor 412 and the stator 413 use the electromagnet. The same applies to the following modified examples 5, 6.

The susceptor 141 is connected to the rotating shaft 411 in a state of holding the wafer W on its upper surface, and is rotated by the rotating mechanism. As a result of this, the wafer W is rotated by the rotating mechanism.

The susceptor 141 has an internal space for holding the substrate electrode block 142.

The substrate electrode block 142 is disposed in the inside of the susceptor 141, and is not rated by being fixed to the bottom plate 415.

The voltage waveforms RF1, RF2 (the voltage waveform in which the RF high-frequency voltage V1 and the RF low-frequency voltage V2a are superimposed, and the voltage waveform in which the RF high-frequency voltage V1 and the RF low-frequency voltage V2b are superimposed) are supplied to the substrate electrode 15 in the chamber 11 from the RF high-frequency power source 21 and the RF low-frequency power sources 22a, 22b disposed on the outside of the chamber 11.

By rotating the wafer W, diagonal ions are incident on the wafer W from all directions.

(2) Modified Example 5

Figure 21:
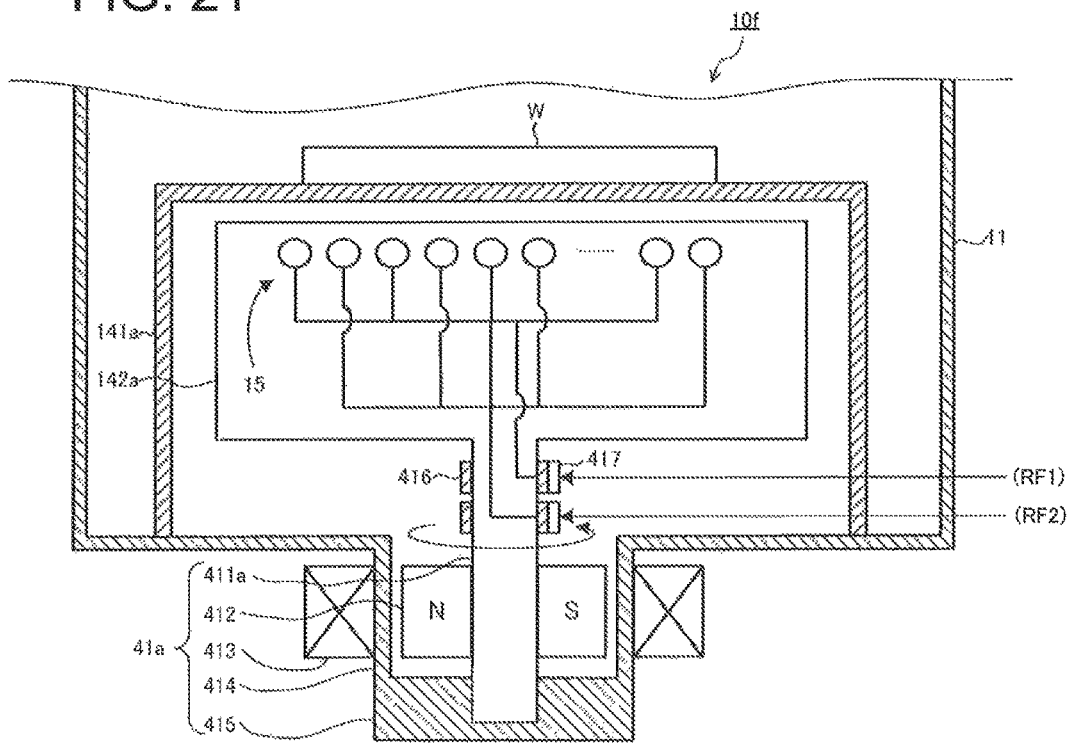
FIG. 21 is a partial configuration diagram of a plasma processing apparatus 10f according to a modified example 5.

FIG. 21 is a partial configuration diagram of a plasma processing apparatus 10f according to the modified example 5. The plasma processing apparatus 10f has a susceptor 141a, a substrate electrode block 142a, and a motor 41a, in place of the susceptor 14b and the wafer rotating mechanism 18 in the plasma processing apparatus 10d.

The motor 41a is provided for rotating the substrate electrode block 142a, and has a rotating shaft 411a, the rotor 412, the stator 413, the side plate 414, the bottom plate 415, ring electrodes 416, and brush electrodes 417.

The rotating shaft 411a, the rotor 412, and the stator 413 form a rotating mechanism. The rotating shaft 411a is connected to the substrate electrode block 142a. The rotor 412 is a magnet disposed on a side surface of the rotating shaft 411a. The stator 413 is an electromagnet disposed on the outside of the side plate 414 so as to approximate to the rotor 412 with the side plate 414 therebetween. By a magnetic force generated by periodically changing the north pole and the south pole of the magnetic field of the stator 413, the rotor 412 rotates with respect to the stator 413. As a result of this, the rotating shaft 411a and the rotor 412 in the chamber 11 (vacuum side), and the stator 413 on the outside of the chamber 11 (atmosphere side) are separated from each another.

The ring electrode 416 and the brush electrode 417 are provided for securing an electrical connection with respect to the substrate electrode 15 during the rotation of the rotating shaft 411a, by being brought into contact with each other in a state where they are slid relative to each other. The ring electrode 416 is a ring-shaped electrode disposed by being fixed to an outer periphery of the rotating shaft 411a. The brush electrode 417 is a brush-shaped electrode which is brought into contact with the ring electrode 416 by sliding relative to the ring electrode 416, during the rotation of the rotating shaft 411a.

The voltage waveforms RF1, RF2 (the voltage waveform in which the RF high-frequency voltage V1 and the RF low-frequency voltage V2a are superimposed, and the voltage waveform in which the RF high-frequency voltage V1 and the RF low-frequency voltage V2b are superimposed) are supplied to the substrate electrode 15 in the chamber 11 from the RF high-frequency power source 21 and the RF low-frequency power sources 22a, 22b disposed on the outside of the chamber 11 via the brush electrodes 417 and the ring electrodes 416.

The susceptor 141a has an internal space for holding the substrate electrode block 142a. The susceptor 141a is not rotated by being fixed to the chamber 11.

The substrate electrode block 142a is disposed in the inside of the susceptor 141a. The substrate electrode block 142a is connected to the rotating shaft 411a, and is rotated by the rotating mechanism. As a result of this, the substrate electrode 15 is rotated by the rotating mechanism.

By rotating the substrate electrode 15, an electric field distribution generated on the wafer W is rotated, resulting in that diagonal ions are incident on the wafer W from all directions.

Note that the plasma processing apparatus 10f may have an electrostatic chuck. In this case, a DC voltage is supplied to the electrostatic chuck via the brush electrode, as will be described in the next modified example 6.

(3) Modified Example 6

Figure 22:
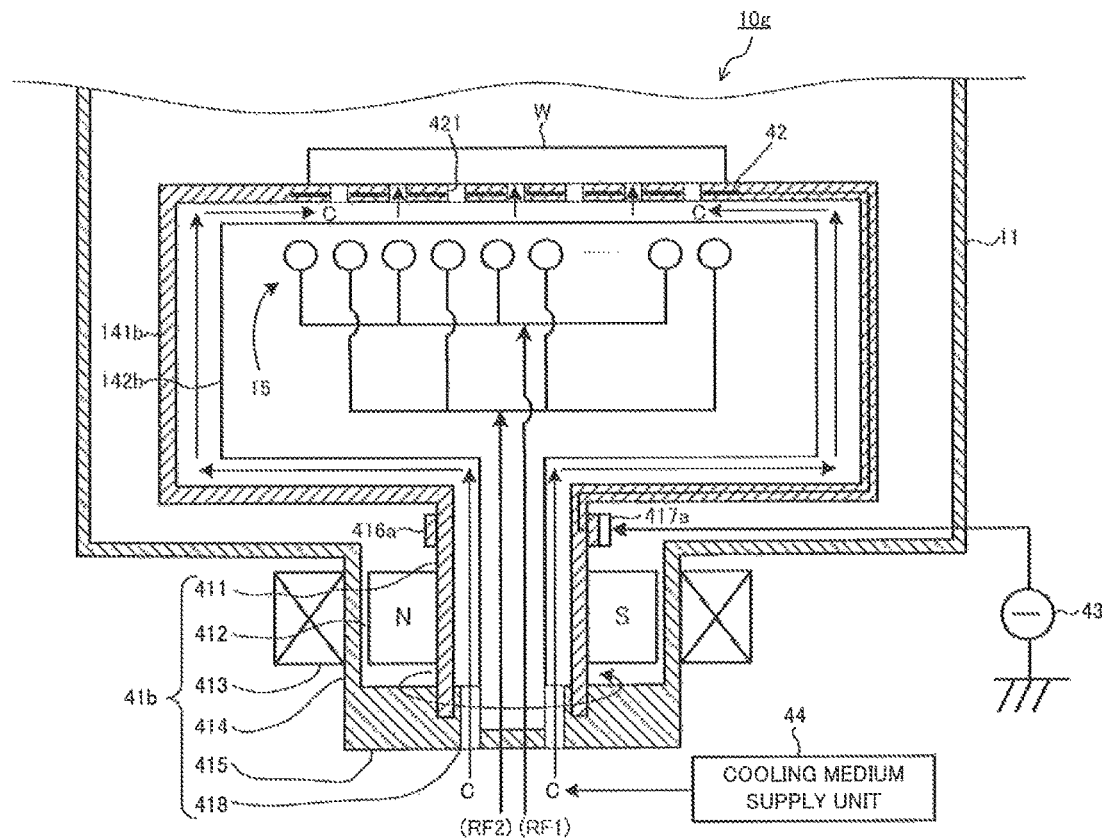
FIG. 22 is a partial configuration diagram of a plasma processing apparatus 10g according to a modified example 6.

FIG. 22 is a partial configuration diagram of a plasma processing apparatus 10g according to the modified example 6. The plasma processing apparatus 10g has a susceptor 141b, a substrate electrode block 142b, a motor 41b, an electrostatic chuck 42, a DC power source 43, and a cooling medium supply unit 44, in place of the susceptor 14b and the wafer rotating mechanism 18 in the plasma processing apparatus 10d.

The motor 41b is provided for rotating the susceptor 141, and has the rotating shaft 411, the rotor 412, the stator 413, the side plate 414, the bottom plate 415, a ring electrode 416a, a brush electrode 417a, and an opening 418.

The rotating shaft 411, the rotor 412, and the stator 413 form a rotating mechanism. The configuration, the operation and the like of the rotating mechanism are substantially similar to those of the modified example 4, so that detailed explanation thereof will be omitted.

The ring electrode 416a and the brush electrode 417a are provided for securing an electrical connection with respect to an internal electrode of the electrostatic chuck 42 during the rotation of the rotating shaft 411, by being brought into contact with each other in a state where they are slid relative to each other. The ring electrode 416a is a ring-shaped electrode disposed by being fixed to an outer periphery of the rotating shaft 411. The brush electrode 417a is a brush-shaped electrode which is brought into contact with the ring electrode 416a by sliding relative to the ring electrode 416a, during the rotation of the rotating shaft 411.

The electrostatic chuck 42 is provided for electrostatically attracting the wafer W, and has a plurality of openings 421. The internal electrode of the electrostatic chuck 42 is a kind of mesh-shaped electrode, and functions as an attraction electrode having a plurality of openings.

Figure 23:
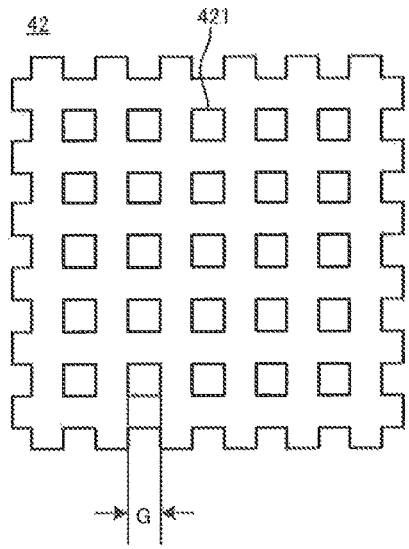
FIG. 23 and FIG. 24 are diagrams each illustrating one example of an electrostatic chuck 42.
Figure 24:
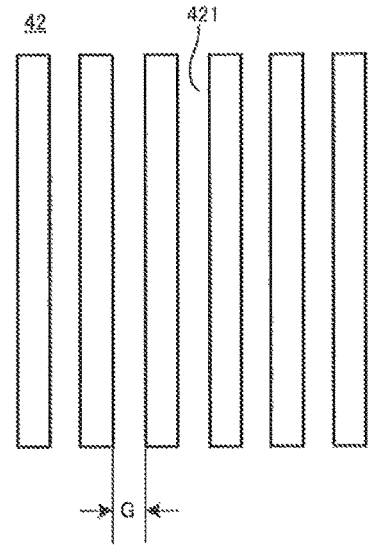

FIG. 23 and FIG. 24 are plan views each illustrating one example of the internal electrode of the electrostatic chuck 42. In FIG. 23, square-shaped openings (air gaps) 421 are arranged in lines in the vertical and horizontal two directions (a kind of mesh-shaped electrode). In FIG. 24, rectangular (line-shaped) openings (air gaps) 421 are arranged in lines (a kind of line-shaped electrode). In FIG. 23 and FIG. 24, the rectangular openings are arranged in two directions and in one direction, respectively.

The line-shaped openings 421 illustrated in FIG. 24 are suitable for a case where the susceptor 14, the substrate electrode 15 and the like are not rotated as described in the first and second embodiments. In this case, an axis of the opening 421 is preferably made to coincide with the axis of the electrode element E (refer to FIG. 2, FIG. 5 and FIG. 18).

In this case, the shape of the opening 421 is set to a rectangular shape, but, it is also possible to employ a circular opening, an elliptical opening and the like, in place of the rectangular opening.

As illustrated in FIG. 23 and FIG. 24, the opening 421 has a width G. As will be described later, the width G is preferably 2 to 5 mm.

The DC power source 43 supplies a DC voltage to the internal electrode of the electrostatic chuck 42, thereby making the electrostatic chuck 42 electrostatically attract the wafer W. The DC voltage from the DC power source 43 is supplied to the internal electrode of the electrostatic chuck 42 in the susceptor 141b via the brush electrode 417a and the ring electrode 416a.

The cooling medium supply unit 44 supplies a cooling medium C for cooling the wafer W. From the point of view of inertness, thermal conductivity and the like, it is preferable to use He, for example, as the cooling medium C.

The susceptor 141b has openings 421 for introducing the cooling medium C. The bottom plate 415 has the opening 418 for introducing the cooling medium C into the susceptor 141b. The cooling medium C supplied from the cooling medium supply unit 44 passes through the opening 418 and the inside of the susceptor 141b to be supplied to a rear surface of the wafer W through the openings 143, thereby cooling the wafer W. The cooling medium C after cooling the wafer W is released in the chamber 11, and is exhausted to the outside from the exhaust port 12.

(4) Modified Example 7

It can also be considered that, in order to make the susceptor 14 hold the wafer W, the low-frequency voltages for introducing ions and the DC voltage for electrostatic attraction are superimposed to be applied to the substrate electrode 15. For example, in the first to third embodiments, a DC voltage from one DC power source is superimposed on the low-frequency voltages to be applied to the substrate electrode 15. In this case, the substrate electrode 15 functions also as an internal electrode for electrostatic chuck, and accordingly, the electrostatic chuck 42 illustrated in FIG. 22 is not required.

At this time, for example, there is a possibility that the RF low-frequency voltages V2a to V2d from the RF low-frequency power sources 22a to 22d illustrated in FIG. 14 flow, via the DC power source, into the electrode elements E1 to E4 of the other groups. In order to prevent the inflow, it is preferable to add a filter mechanism which cuts an AC component, to the DC power source. The filter mechanism can be formed of a capacitance and an inductance, for example.

Note that when relatively rotating between the wafer W and the substrate electrode 15 as described in the modified examples 4 to 6, it becomes difficult to attract the wafer W by using the substrate electrode 15. In this case, it is preferable to provide the electrode for electrostatic attraction (the internal electrode of the electrostatic chuck 42) in the vicinity of the wafer W, as described in the modified example 6.

(Fourth Embodiment)

Figure 25:
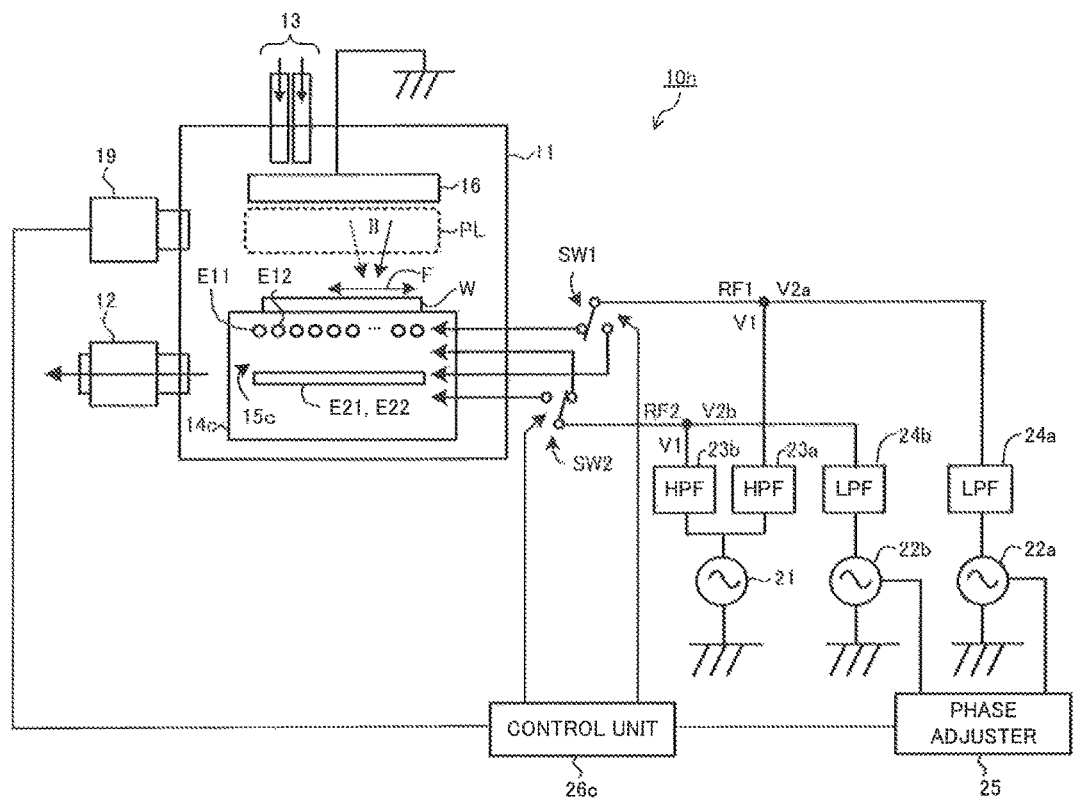
FIG. 25 is a schematic configuration diagram of a plasma processing apparatus 10h according to a fourth embodiment.

FIG. 25 is a schematic configuration diagram of a plasma processing apparatus 10h according to a fourth embodiment. The plasma processing apparatus 10h has the chamber 11, the exhaust port 12, the process gas introduction pipe 13, a susceptor 14c, a substrate electrode 15c, the counter electrode 16, the termination detector 19, the RF high-frequency power source 21, the RF low-frequency power sources 22a, 22b, the filters 23a, 23b, 24a, 24b, the phase adjuster 25, a control unit 26c, and switches SW1, SW2. Note that the illustration of capacitors is omitted for easier view.

Note that it is also possible that the substrate electrode 15 is formed of three groups of or five groups or more of electrode elements, and the RF low-frequency voltages V2 having the phase differences are applied to the respective groups of electrode elements, as in the second embodiment and the modified examples.

Compared to the plasma processing apparatus 10d, the plasma processing apparatus 10h does not have the wafer rotating mechanism 18, and uses the substrate electrode 15c, in place of the substrate electrode 15.

Figure 26:
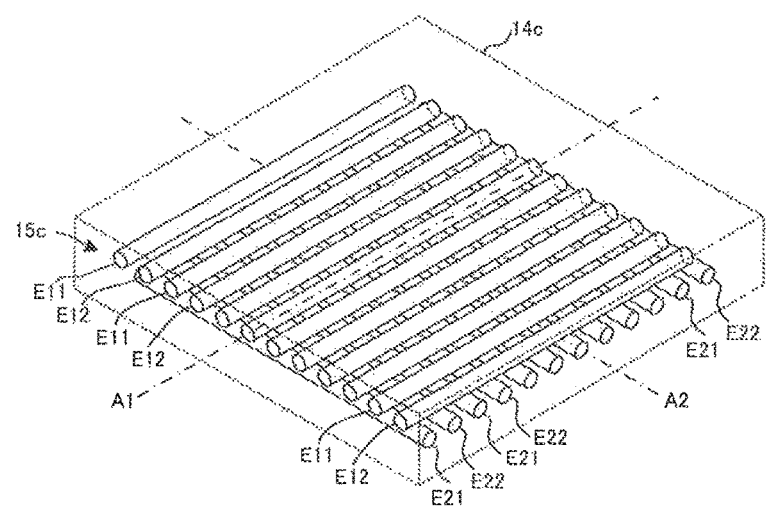
FIG. 26 is a perspective view illustrating one example of a configuration of a substrate electrode 15c.

FIG. 26 is a perspective view illustrating one example of a configuration of the substrate electrode 15c. The substrate electrode 15c is formed of electrode elements E11, E12, and electrode elements E21, E22, in which the former are arranged on the latter. Here, it can be considered that the electrode elements E11, E12 form a first substrate electrode, and the electrode elements E21, E22 form a second substrate electrode. Specifically, the substrate electrode 15c has these first and second substrate electrodes.

The electrode elements E11, E12 correspond to the electrode elements E1, E2 in the first embodiment, and are alternately arranged along an axial direction A1.

The electrode elements E21, E22 are alternately arranged along an axial direction A2 under the electrode elements E11, E12. These axial directions A1, A2 are mutually different (the directions are perpendicular to each other, for example).

The control unit 26c can make the switches SW1, SW2 switch the destination of input of the RF high-frequency voltage V1 and the RF low-frequency voltages V2a, V2b from the RF high-frequency power source 21 and the RF low-frequency power sources 22a, 22b to either the electrode elements E11, E12 or the electrode elements E21, E22. Specifically, the switching is made to set either the electrode elements E11, E12 or the electrode elements E21, E22 as a substantial substrate electrode.

As described above, the switches SW1, SW2 apply the RF high-frequency voltage V1 and the plurality of RF low-frequency voltages V2a, V2 by switching the first and second substrate electrodes (the electrode elements E11, E12, and the electrode elements E21, E22). This means that the switches SW1, SW2 function as a switching unit.

Since the axial direction A1 of the electrode elements E11, E12 is different from the axial direction A2 of the electrode elements E21, E22, it becomes possible to relatively rotate the wafer W and the incident direction of ions II, although the wafer rotating mechanism 18 is not provided. Specifically, it becomes possible to deal with precision processing (vertical processing) of a sidewall of via hole.

(Fifth Embodiment)

Figure 27:
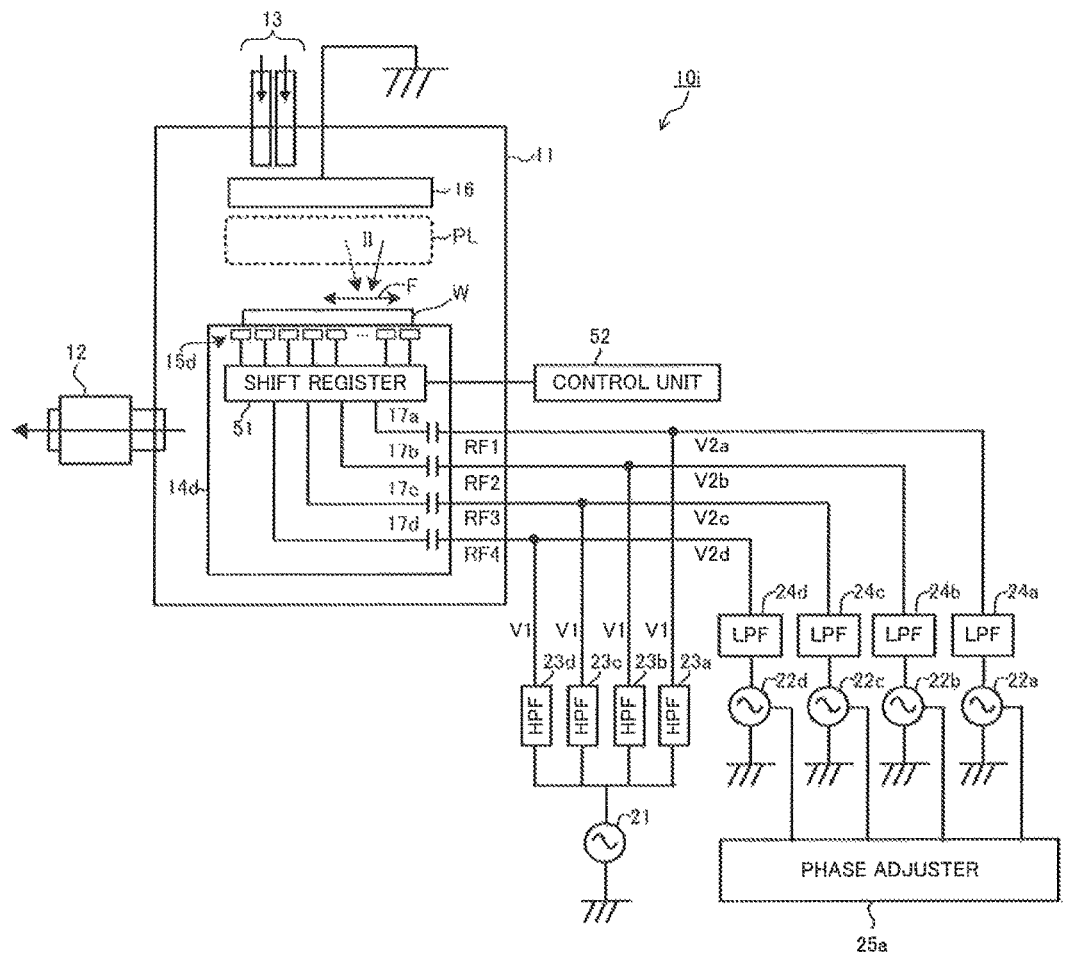
FIG. 27 is a schematic configuration diagram of a plasma processing apparatus 10i according to a fifth embodiment.

FIG. 27 is a schematic configuration diagram of a plasma processing apparatus 10i according to a fifth embodiment. The plasma processing apparatus 10i has the chamber 11, the exhaust port 12, the process gas introduction pipe 13, a susceptor 14d, a substrate electrode 15d, the counter electrode 16, a shift register 51, a control unit 52, the capacitors 17a to 17d, the RF high-frequency power source 21, the RF low-frequency power sources 22a to 22d, the filters 23a to 23d, and 24a to 24d, and the phase adjuster 25a.

Figure 28:
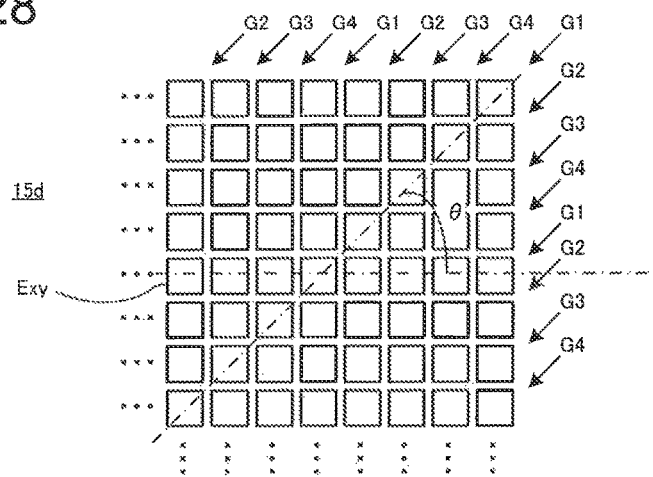
FIG. 28 is a plan view illustrating one example of a configuration of a substrate electrode 15d.
Figure 29A:
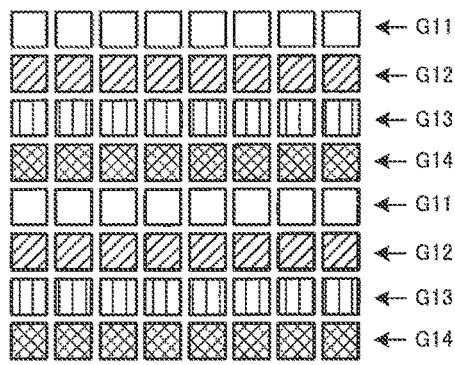
FIG. 29A to FIG. 29D are plan views each illustrating one example of a selection state of the substrate electrode 15d.
Figure 29B:
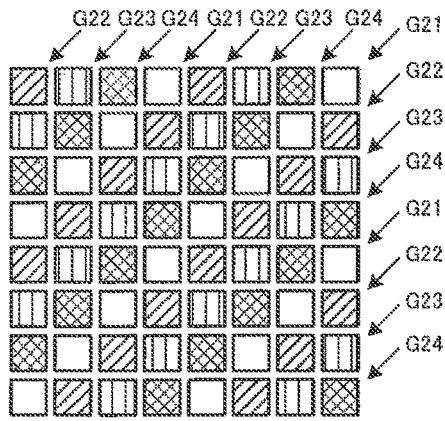
Figure 29C:
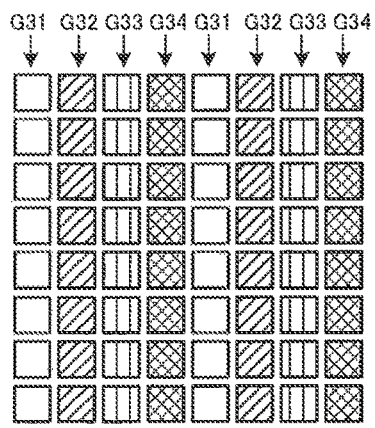
Figure 29D:
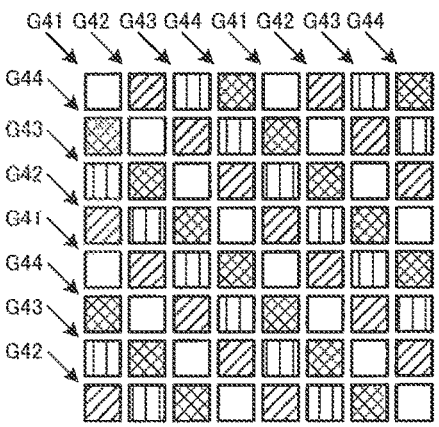

FIG. 28 is a plan view illustrating a state where the substrate electrode 15d is seen from the above. The substrate electrode 15d has electrode elements Exy which are arranged in lines in the vertical and horizontal two directions. Here, although the electrode elements Exy are arranged in the vertical and horizontal two directions, which are orthogonal to each other, the directions are not necessarily required to be orthogonal to each other. There is no problem if the electrode elements Exy are arranged in lines in mutually different first and second directions.

Here, the electrode element Exy has a rectangular shape (square shape) when seen from the above, but, it may also be formed to have a circular shape.

The shift register 51 selects the electrode elements Exy so that the electrode elements Exy are classified into four groups G1 to G4 (line-shaped groups) which are parallel to one another (arranged in approximately the same direction θ). The shift register 51 functions as a selecting unit that selects, from a plurality of electrode elements, the plurality of electrode element groups arranged along one direction. The four groups G1 to G4 are connected to the RF low-frequency power sources 22a to 22d. As the four groups G1 to G4, a plurality of groups G11 to G14, G21 to G24, ..., Gn1 to Gn4 in accordance with the direction θ can be selected.

FIG. 29A to FIG. 29D illustrate cases where the electrode elements Exy are classified into (selected as) groups G11 to G14, groups G21 to G24, groups G31 to G34, and groups G41 to G44, in which the direction θ corresponds to 0°, 45°, 90°, and 135°, respectively.

In this case, the shift register 51 selects any of first to fourth electrode element groups (the groups G1 to G14, the groups G21 to G24, the groups G31 to G34, and the groups G41 to G44) which are arranged along a first direction (0° direction), a second direction (90° direction), a third direction being an intermediate direction between the first and second directions (45° direction), and a fourth direction being an intermediate direction between the second and first directions (135° direction), respectively.

Here, although the third direction is set to the direction which is right between the first and second directions, it is also possible to set an arbitrary intermediate direction between the first and second directions. Further, it is also possible to set an arbitrary intermediate direction between the second and first directions, as the fourth direction. Further, it is also possible to set a plurality of intermediate directions between the first and second directions.

The control unit 52 controls the shift register 51 to change the grouping of the electrode elements Exy so that the direction θ sequentially rotates. For example, it is set that the groups G11 to G14, the groups G21 to G24, the groups G31 to G34, and the groups G41 to G44 in FIG. 29A to FIG. 29D are periodically and repeatedly selected. This means that the direction θ in which the electrode elements Exy are grouped rotates. The groups G11 to G14 correspond to both cases where θ equals to 0° and where θ equals to 180°, so that when the groups G11 to G14 are selected after the selection of the groups G41 to G44, this means that the electric field from the substrate electrode 15d is rotated.

By rotating the line-shaped groups, the electric field distribution generated on the wafer W is rotated, resulting in that diagonal ions are incident on the wafer W from all directions. Specifically, it becomes possible to achieve an effect similar to that achieved when the wafer W is rotated.

EXAMPLES

Figure 31A:
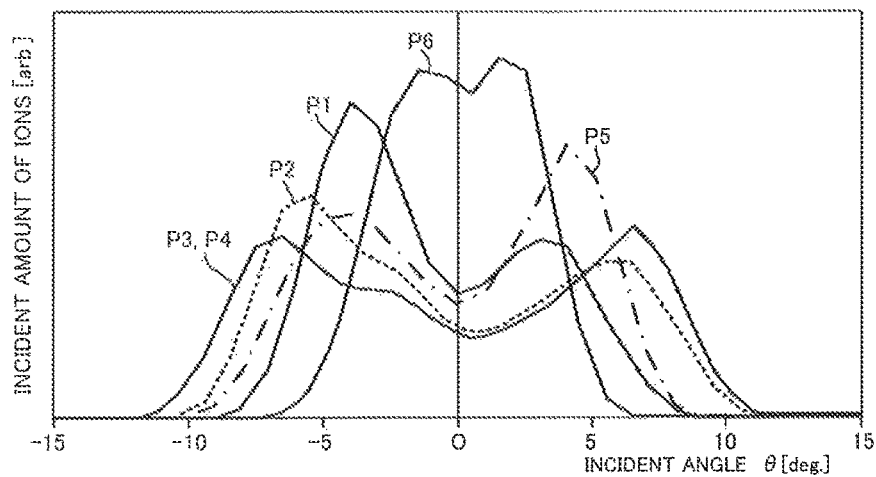
FIG. 31A and FIG. 31B are graphs each illustrating an example of incident angle distribution of ions II which are incident on the wafer W.
Figure 31B:
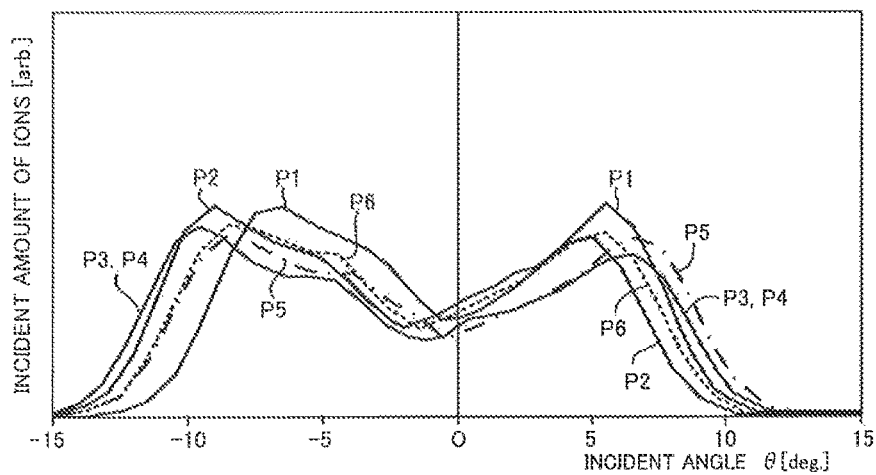
Figure 32:
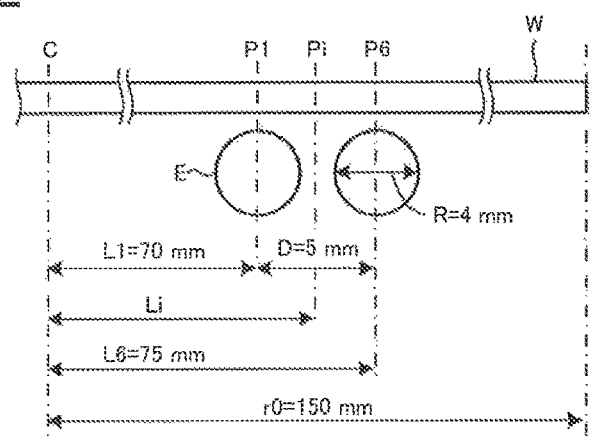
FIG. 32 is a schematic diagram illustrating positions P1 to P6 on the wafer W.

Examples will be described. FIG. 30A to FIG. 30C, FIG. 31A, and FIG. 31B are graphs each illustrating a result of plasma simulation of an angle distribution of ions II which are incident on the wafer W in the plasma processing apparatus 10. The above-described simulation is conducted by using a commercially available software (VizGlow). Incident amounts of ions II over one period of the RF low-frequency voltage are integrated to calculate the angle distribution of the ions incident on the substrate. FIG. 32 is a schematic sectional diagram illustrating positions P1 to P6 (incident positions of ions II) on the wafer W.

As illustrated in FIG. 32, in this case, the wafer W having a radius r0 of 150 mm was used, and as the substrate electrode 15, the electrode elements E each having a diameter R of 4 mm and an approximately column shape were arranged with an interval D (distance between center axes) of 5 mm provided therebetween. Distances L from a center C of the wafer W to the respective positions P1 to P6 on the wafer W are 70, 71, 72, 73, 74, and 75 mm. The positions P1, P6 are respectively positioned on the axes of the two electrode elements E, and the other positions P2 to P5 are disposed between the positions P1 and P6. A portion at which the distance L is 72.5 mm is a portion in which the distances from these electrode elements to the portion are equal, and is at an intermediate position between the positions P3 and P4.

Note that the angle distribution of ions in other electrode elements E is similar to that when the distances L are 70 to 75 mm. Specifically, it can be considered that the angle distribution of ions varies in a period corresponding to the interval D by reflecting the periodicity of arrangement of the electrode elements E. Accordingly, the uniformity on the wafer W of the incident angle distribution is indicated, by setting the result of analysis at the positions P1 to P6 as a representative.

Figure 30A:
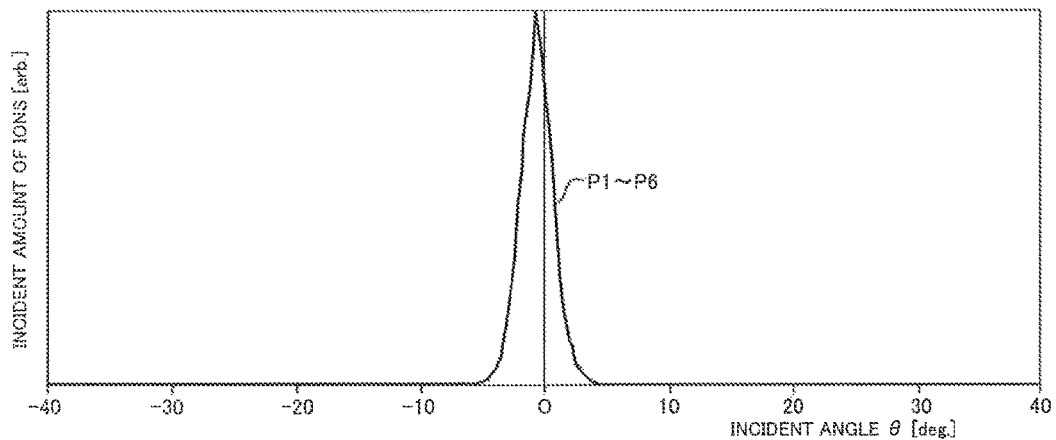
FIG. 30A to FIG. 30C are graphs each illustrating an example of incident angle distribution of ions II which are incident on the wafer W.
Figure 30B:
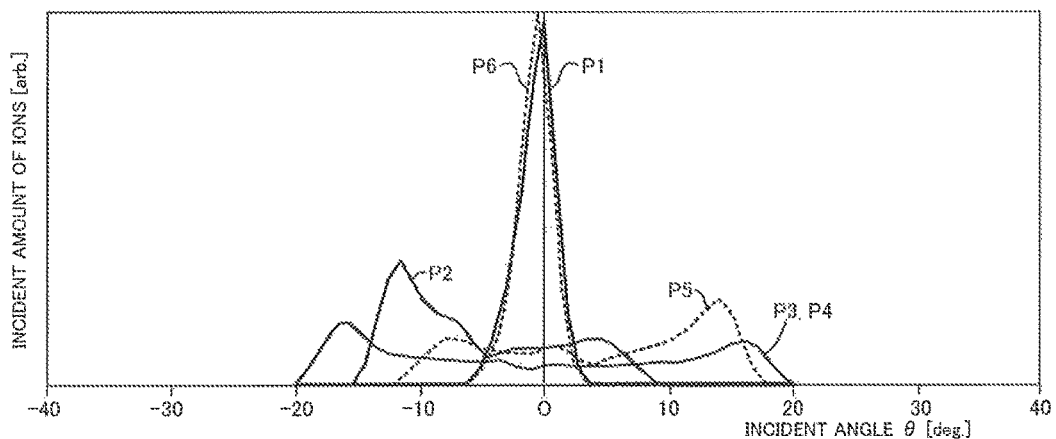
Figure 30C:
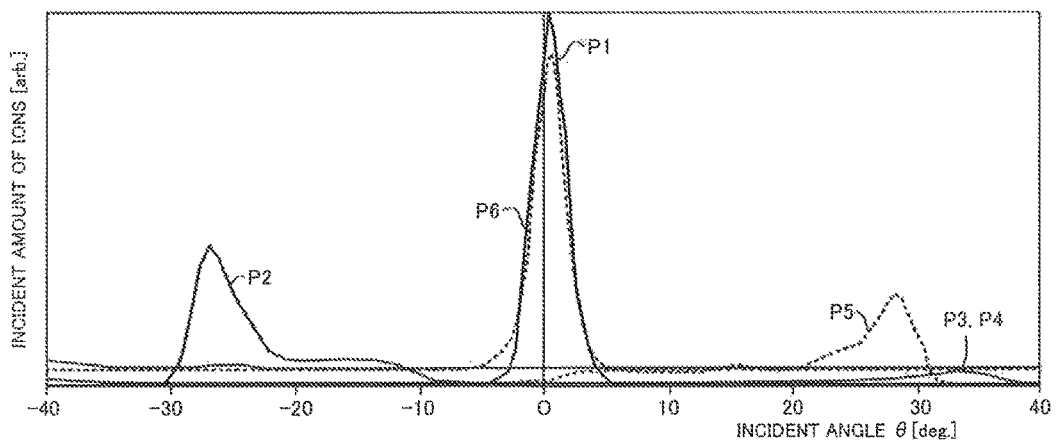

In each of FIG. 30A to FIG. 30C, the electrode elements E are classified into two groups which are alternately arranged, and the RF low-frequency voltages V2a, V2b having the phase difference α of 0, π/2, or π are applied. In FIG. 31A, the electrode elements E are classified into three groups which are sequentially arranged, and RF low-frequency voltages V2a, V2b, V2c having phase differences α1, α2 of 2π/3, 4π/3 are applied. In FIG. 31B, the electrode elements E are classified into four groups which are sequentially arranged, and RF low-frequency voltages V2a to V2d having phase differences α1 to α3 of π/2, π, 3π/2 are applied.

(1) When the phase difference α is 0 in the two groups of electrode elements (FIG. 30A)

When the phase difference α is 0 in the two groups of electrode elements, the RF low-frequency voltages V2 having the same phase are applied to all of the electrode elements. In this case, the incident angle θ of ions II is approximately 0 at all of the positions P1 to P6 (the ions II are approximately vertically incident). In this case, a result which is approximately similar to that when the substrate electrode 15 is not divided, is obtained. Specifically, the result is similar to that obtained in the plasma processing apparatus 10x illustrated in FIG. 5 (normal plate electrode RIE (Reactive Ion Etching) apparatus).

Note that the reason why the incident angle θ of the ions II has a distribution of about −2 to about 2° is because there is an influence of thermal fluctuation (the ions II have random thermal velocity components).

(2) When the phase difference α is π/2 in the two groups of electrode elements (FIG. 30B)

When the phase difference α is π/2 in the two groups of electrode elements, the vertically incident ions II are reduced at the positions P2 to P5, and the ions II are alternately incident at positive and negative incident angles θ (about −15 to about 15°). It can be considered that this is because, since there is the phase difference between the electrode elements, the electric field F in a direction perpendicular to the axial direction A is generated.

On the contrary, it is difficult to say that the vertically incident ions II are reduced at the positions P1, P6 (on center axes of the electrode elements), when compared to FIG. 30A. Specifically, the positions P1, P6 are sort of singular points in which the amount of diagonal incidence of ions II is small.

The reason thereof can be considered as follows. Specifically, in this case, electric fields F in the opposite directions act between the respective electrode elements E in the left-hand neighbor and the right-hand neighbor. It can be considered that the electric fields F in the opposite directions are balanced at a position right above the axes of the electrode elements E, resulting in that the electric field F in the direction Ah perpendicular to the axial direction A (refer to FIG. 2) is difficult to be generated. If the electric field F is not generated, the diagonal incidence of ions II except for the thermal fluctuation component does not virtually occur (only the vertical incidence occurs).

(3) When the phase difference α is π in the two groups of electrode elements (FIG. 30C)

When the phase difference α is π in the two groups of electrode elements, the vertically incident ions II are reduced at the positions P2 to P5, and the ions II are alternately incident at positive and negative incident angles θ (about −30 to about 30°). The incident angle θ is greater than the incident angle in the case of FIG. 30B.

On the contrary, it is difficult to say that the vertically incident ions II are reduced at the positions P1, P6 (on the center axes of the electrode elements), similar to FIG. 30B. It can be considered that the reason thereof is because the electric fields F in the opposite directions are balanced at a position right above the axes of the electrode elements E, similar to (2).

(4) In the case of three groups of electrode elements (FIG. 31A)

In the case of three groups of electrode elements, the vertically incident ions II are reduced at all of the positions P1 to P6. The positions P1, P6 (on the center axes of the electrode elements) are also not the singular points. The ions II are approximately alternately incident at the positive and negative incident angles θ (about −8 to about 8°).

(5) In the case of four groups of electrode elements (FIG. 31B)

In the case of four groups of electrode elements, the vertically incident ions II are reduced at all of the positions P1 to P6. The positions P1, P6 (on the center axes of the electrode elements) are also not the singular points. The ions II are approximately alternately incident at the positive and negative incident angles θ (about −10 to about 10°).

As described above, by increasing the number of groups of the electrode elements (number of division of the substrate electrode 15) to 2, 3, 4, and by applying the RF low-frequency voltages V2 having the phase difference, it becomes possible that the ions II are diagonally incident from both directions of the trench at all the positions on the wafer.

When the number of groups is two, there are generated, on the center axes of the electrode elements, the singular points in which the number of diagonally incident ions II is small, but, when the number of groups is three or more, the tendency is lowered. Specifically, in order to eliminate the singular points, it is particularly desirable to set the number of groups to three or more. The uniform diagonal incidence can occur on the wafer W having a diameter of 300 mm (radius r0 of 150 mm), as described in the examples.

When the number of groups is four, the dependence of positions P1 to P6 of the distribution of ions II is further reduced. It can be considered that the larger the number of the groups, the smaller the positional dependence of the distribution of ions II.

Figure 33A:
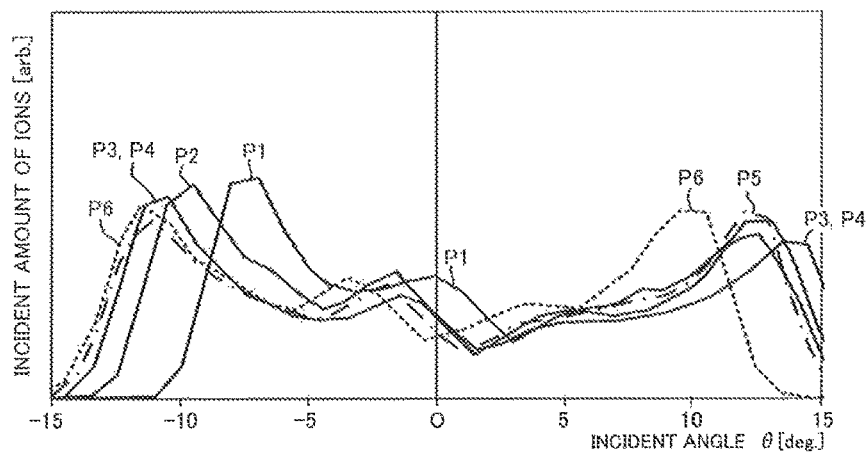
FIG. 33A to FIG. 33C are graphs each illustrating an example of incident angle distribution of ions II which are incident on the wafer W.
Figure 33B:
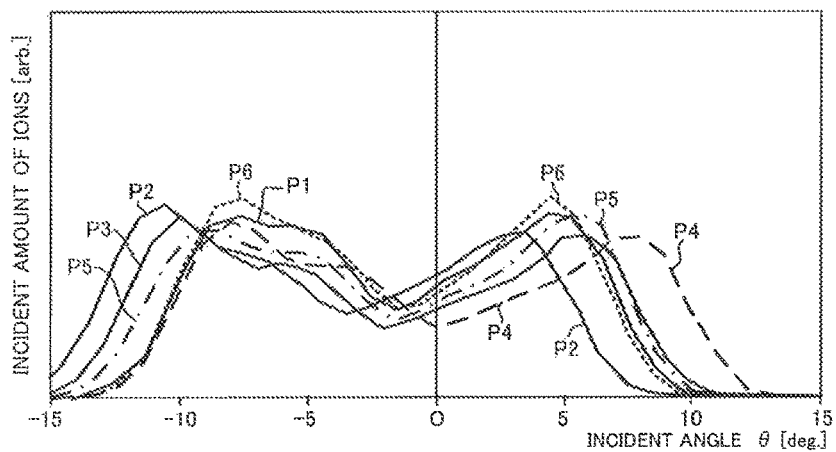
Figure 33C:
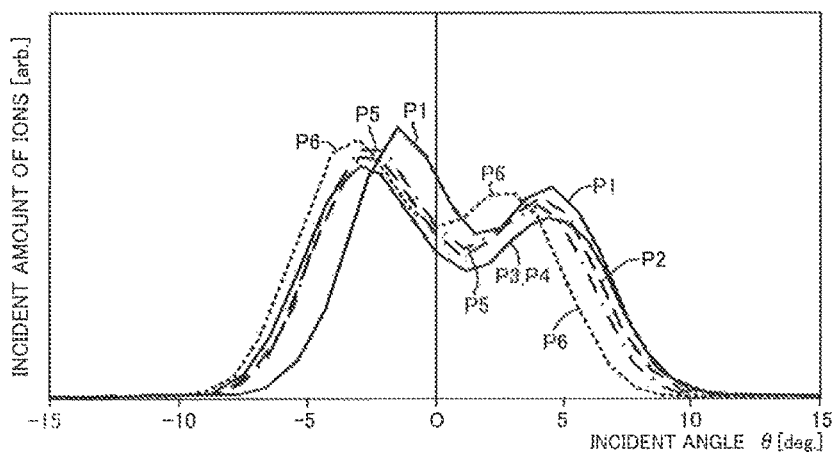
Figure 34A:
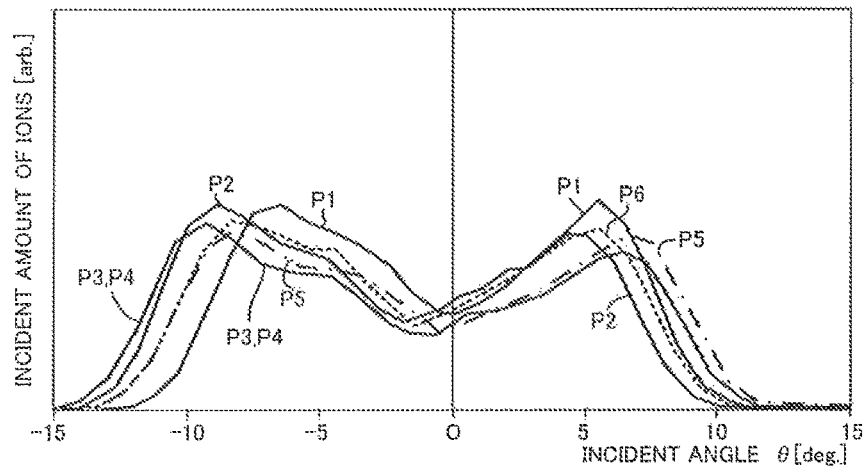
FIG. 34A to FIG. 34E are graphs each illustrating an example of incident angle distribution of ions II which are incident on the wafer W.
Figure 34B:
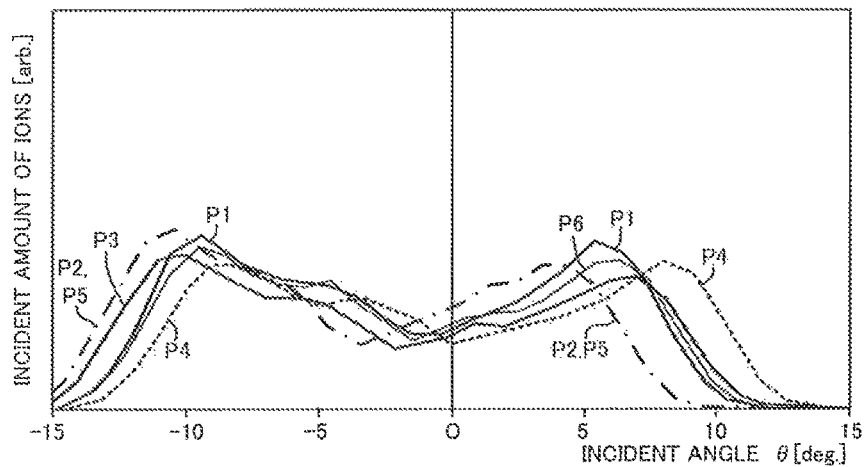
Figure 34C:
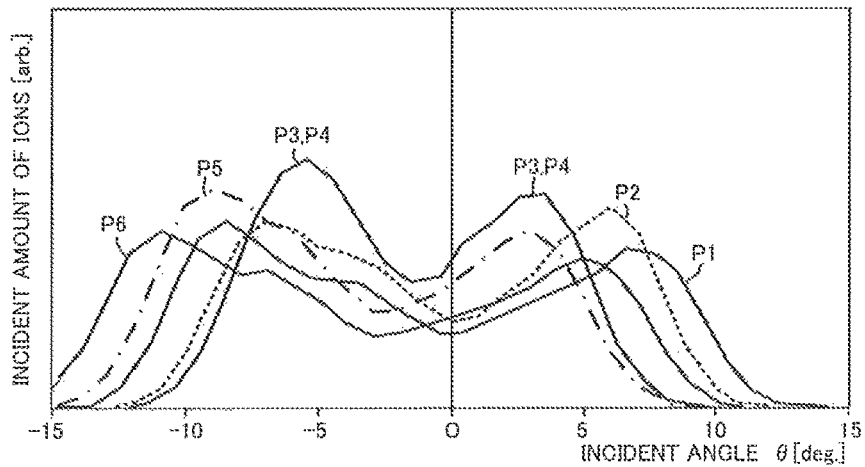
Figure 34D:
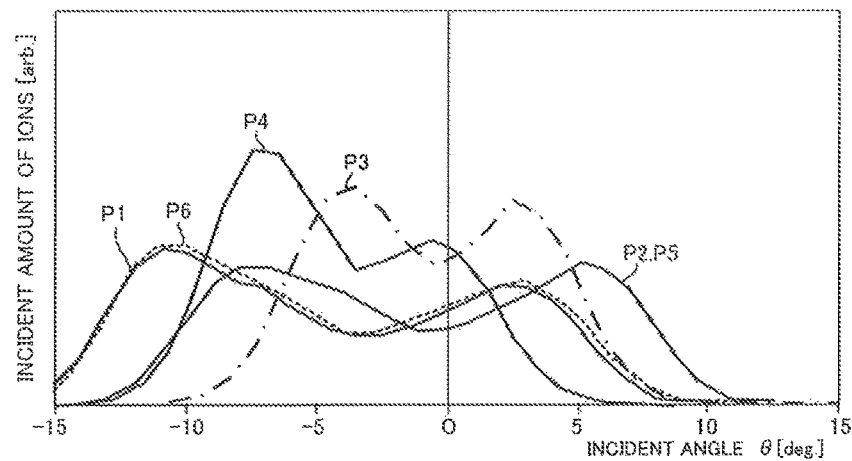
Figure 34E:
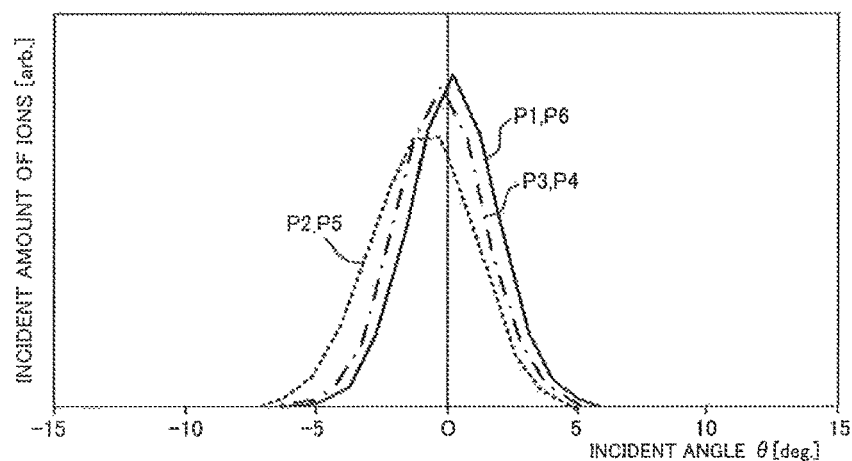

(6) When the voltage is changed in the case of four groups of electrode elements (FIG. 33A to FIG. 33C)

Cases where the voltage V02 of the RF low-frequency voltages (refer to expression (2)) is changed in the case of four groups of electrode elements, will be described. FIG. 33A to FIG. 33C are graphs illustrating results of plasma simulation of angle distributions of the ions II which are incident on the wafer W in the plasma processing apparatus 10 when the voltage V02 is set to 2000 V, 1000 V, 500 V, in the four groups of electrode elements.

As illustrated in FIG. 33A to FIG. 33C, there is a tendency that when the voltage V02 is increased, the incident angle θ of ions II is increased. The incident angle θ is changed from about 2 to 30 to about 100, when the voltage V02 from 500 V to 2000 V is applied. Specifically, by controlling the voltage V02 of the RF low-frequency power sources 22a to 22d, the incident angle θ of the ions II can be changed.

(7) When the wafer W is relatively rotated with respect to the substrate electrode 15

A case where the wafer W is relatively rotated with respect to the substrate electrode 15 will be described. As described above, it can be said that in the third to fifth embodiments and the modified examples 4 to 6, the wafer W is relatively rotated with respect to the substrate electrode 15. In the fourth and fifth embodiments, the substrate electrode 15 and the wafer W themselves are not rotated, but, since the direction of electric field applied to the wafer W is changed, this case is substantially similar to the case where the substrate electrode 15 is rotated.

Although not illustrated, according to the simulation, the result when the wafer W and the like are rotated is approximately similar to the averaged result when the wafer W is not rotated (FIG. 30A to FIG. 30C, FIG. 31A, FIG. 31B, FIG. 33A to FIG. 33C).

(8) Influence of air gap size (width of opening 421) G of the internal electrode of the electrostatic chuck 42.

FIG. 34A to FIG. 34E are graphs illustrating results of plasma simulation of angle distributions of the ions II which are incident on the wafer W in the plasma processing apparatus 10 when the air gap size (the width of the opening 421) G of the internal electrode of the electrostatic chuck 42 (the width of the internal electrode) is changed.

Figure 35:
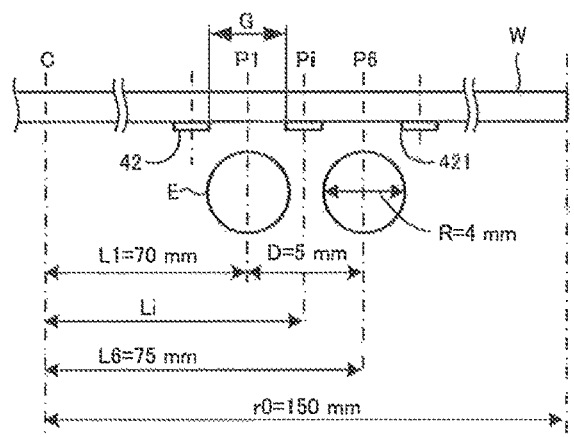
FIG. 35 is a schematic diagram illustrating a positional relationship of electrode elements E and the electrostatic chuck 42.

FIG. 34A to FIG. 34E correspond to cases where the internal electrode of the electrostatic chuck 42 is not provided, and the airgap sizes G are 4, 2, 1, 0 mm (correspond to the internal electrode sizes 1, 3, 4, 5 mm), respectively. FIG. 35 is a schematic sectional diagram illustrating the electrostatic chuck 42 on the wafer W at this time. Here, the electrode element E of the substrate electrode 15 is arranged on the center of the opening 421 of the electrostatic chuck 42.

As illustrated in FIG. 34A to FIG. 34E, when the air gap size G of the electrostatic chuck 42 becomes 2 mm or less, the distribution of the incident angles θ of the ions II is deteriorated. There is no large difference between the case where the air gap size G is up to 2 mm and the case where the electrostatic chuck (DC electrode) 42 is not provided.

As described above, it is preferable that the interval D between the electrode elements E is set to 5 mm or less, for example. When this is taken into consideration, it is preferable to set the air gap size (the width of the opening 421) G of the electrostatic chuck 42 to 2 mm to 5 mm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A plasma processing apparatus, comprising:
   a chamber;
   an introducing part configured to introduce process gas into the chamber;
   a substrate electrode disposed in the chamber and comprising a plurality of first electrode elements and a plurality of second electrode elements, each of the first electrode elements and each of the second electrode elements being alternately arranged, and having a column shape with an axis, the axes of the first and the second electrode elements being substantially in parallel to each other and to a main surface of the substrate;
   a counter electrode disposed in the chamber and being grounded;
   a substrate holder configured to hold a substrate between the counter electrode and the substrate electrode;
   a high-frequency power source configured to apply a high-frequency voltage of 40 MHz or more to the first and the second electrode elements to generate plasma between the substrate and the counter electrode;
   a first low-frequency power source configured to apply a first low-frequency voltage of 20 MHz or less to the first electrode elements to superimpose the high-frequency voltage and the first low-frequency voltage at the first electrode elements;
   a second low-frequency power source configured to apply a second low-frequency voltage of 20 MHz or less to the second electrode elements to superimpose the high-frequency voltage and the second low-frequency voltage at the second electrode elements;
   a first high-frequency filter disposed between the high frequency power source and the first electrode elements and configured to pass the high-frequency voltage and not to pass the first low-frequency voltage;
   a second high-frequency filter disposed between the high frequency power source and the second electrode elements and configured to pass the high-frequency voltage and not to pass the second low-frequency voltage;
   a first low-frequency filter disposed between the first low frequency power source and the first electrode elements and configured to pass the first low-frequency voltage and not to pass the high-frequency voltage; and
   a second low-frequency filter disposed between the second low frequency power source and the second electrode elements and configured to pass the second low-frequency voltage and not to pass the high-frequency voltage,
   wherein the phase of the first low-frequency voltage applied to the first electrode elements is different from the phase of the second low-frequency voltage applied to the second electrode elements by approximately π/2 or −π/2, and
   wherein the phase of the high-frequency voltage applied to the first electrode elements is substantially as same as the phase of the high-frequency voltage applied to the second electrode elements.

2. The apparatus according to claim 1,
   wherein an interval between adjacent electrode elements is 5 mm or less.

3. The apparatus according to claim 1, further comprising:
   a second substrate electrode that comprises a plurality of electrode elements having axes along a direction different from the predetermined direction; and a switching unit configured to apply the high-frequency voltage and the plurality of low-frequency voltages by switching the substrate electrode and the second substrate electrode.

4. The apparatus according to claim 1, further comprising a rotating mechanism relatively rotating the substrate with respect to the substrate electrode.

5. The apparatus according to claim 1, further comprising a phase adjuster shifting the phases of the plurality of low-frequency voltages from the plurality of low-frequency power sources, in accordance with a progress of a plasma processing process.

6. The apparatus according to claim 1, further comprising:
an attraction electrode disposed between the substrate and the substrate electrode, and having a plurality of openings; and
a direct-current power source configured to supply a direct-current voltage to the attraction electrode to make the attraction electrode attract the substrate.

7. The apparatus according to claim 6,
wherein a width of each of the plurality of openings is not less than 2 mm nor more than 5 mm.

8. The apparatus according to claim 6, further comprising a cooling medium supply unit configured to supply, through the openings, a cooling medium for cooling the substrate.

9. The apparatus according to claim 1,
wherein the first low-frequency voltage applied to the first electrode elements and the second low-frequency voltage applied to the second electrode elements generate electric field at a direction parallel to a main surface of the substrate.

10. A plasma processing apparatus, comprising:
a chamber into which process gas is to be introduced;
a substrate electrode disposed in the chamber and comprising a plurality of first electrode elements and a plurality of second electrode elements, each of the first electrode elements and each of the second electrode elements being alternately arranged, such that axes of the first and the second electrode elements lie substantially in parallel to each other and to a main surface of the substrate;
a counter electrode disposed in the chamber and being grounded;
a high-frequency power source configured to apply a high-frequency voltage of 40 MHz or more to the first and the second electrode elements;
a first low-frequency power source configured to apply a first low-frequency voltage of 20 MHz or less to the first electrode elements to superimpose the high-frequency voltage and the first low-frequency voltage at the first electrode elements; and
a second low-frequency power source configured to apply a second low-frequency voltage of 20 MHz or less to the second electrode elements to superimpose the high-frequency voltage and the second low-frequency voltage at the first electrode elements,
wherein the phase of the first low-frequency voltage applied to the first electrode elements is different from the phase of the second low-frequency voltage applied to the second electrode elements,
wherein the phase of the high-frequency voltage applied to the first electrode elements is substantially as same as the phase of the high-frequency voltage applied to the second electrode elements.

11. The apparatus according to claim 9,
wherein each of the first electrode elements and each of the second electrode elements are alternately arranged.

12. The apparatus according to claim 9, further comprising a substrate holder configured to hold a substrate, the first electrode being disposed on an opposite side of the substrate from the second electrode.

13. The apparatus according to claim 12,
wherein the first low-frequency voltage applied to the first electrode elements and the second low-frequency voltage applied to the second electrode elements generate electric field at a direction parallel to a main surface of the substrate.

* * * * *